US012742100B2

(12) United States Patent
Sato et al.

(10) Patent No.: US 12,742,100 B2
(45) Date of Patent: Sep. 22, 2026

(54) PROTECTIVE SHEET, METHOD FOR PRODUCING ELECTRONIC COMPONENT, AND METHOD FOR PRODUCING GLASS PIECE FORMING DISPLAY SURFACE OF DISPLAY APPARATUS

(71) Applicant: NITTO DENKO CORPORATION, Ibaraki (JP)

(72) Inventors: Satoshi Sato, Ibaraki (JP); Yuichiro Shishido, Ibaraki (JP); Naohide Takamoto, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 103 days.

(21) Appl. No.: 18/698,184

(22) PCT Filed: Sep. 30, 2022

(86) PCT No.: PCT/JP2022/036777
§ 371 (c)(1),
(2) Date: Apr. 3, 2024

(87) PCT Pub. No.: WO2023/058577
PCT Pub. Date: Apr. 13, 2023

(65) Prior Publication Data

US 2024/0409786 A1 Dec. 12, 2024

(30) Foreign Application Priority Data

Oct. 5, 2021 (JP) ................................ 2021-164163
Apr. 6, 2022 (JP) ................................ 2022-063384

(51) Int. Cl.
*C09J 7/38* (2018.01)
*B32B 7/06* (2019.01)
(Continued)

(52) U.S. Cl.
CPC ................ *C09J 7/381* (2018.01); *B32B 7/06* (2013.01); *B32B 27/08* (2013.01); *B32B 27/36* (2013.01);
(Continued)

(58) Field of Classification Search
None
See application file for complete search history.

(56) References Cited

U.S. PATENT DOCUMENTS 5,962,565 A * 10/1999 Pagano .................. C03C 17/32 524/436
2004/0112880 A1 6/2004 Sekiya
(Continued)

FOREIGN PATENT DOCUMENTS

CN 110218528 A 9/2019
CN 110396332 A 11/2019
(Continued)

OTHER PUBLICATIONS

International Search Report for PCT/JP2022/036777 dated Dec. 6, 2022.
(Continued)

*Primary Examiner* — Ramsey Zacharia
(74) *Attorney, Agent, or Firm* — Sughrue Mion, PLLC

(57) ABSTRACT

A protective sheet according to the present invention is a protective sheet for being attached to a protected surface of an electronic component having the protected surface, one surface of a glass piece forming a display surface of a display apparatus, or one surface of a glass plate for obtaining the glass piece. The protective sheet includes a protective layer for being attached to the protected surface of the electronic component, the one surface of the glass piece, or the one surface of the glass plate. The protective layer is made of one of a water-soluble resin composition and a
(Continued)

curable resin composition with its adhesiveness reducible by curing reaction.

5 Claims, 11 Drawing Sheets

(51) Int. Cl.

| | |
|---|---|
| ***B32B 27/08*** | (2006.01) |
| ***B32B 27/36*** | (2006.01) |
| ***H10H 20/01*** | (2025.01) |
| ***H10H 20/854*** | (2025.01) |
| ***H10W 90/00*** | (2026.01) |

(52) U.S. Cl.
CPC .......... *H10H 20/854* (2025.01); *H10W 90/00* (2026.01); *B32B 2255/10* (2013.01); *B32B 2255/26* (2013.01); *B32B 2307/748* (2013.01); *C09J 2203/326* (2013.01); *C09J 2301/502* (2020.08); *H10H 20/0362* (2025.01)

(56) References Cited

U.S. PATENT DOCUMENTS

| | | | | |
|---|---|---|---|---|
| 2006/0105544 | A1 | 5/2006 | Takanashi et al. | |
| 2009/0258187 | A1* | 10/2009 | Brady | C03C 17/32 428/156 |
| 2010/0304551 | A1 | 12/2010 | Takanishi et al. | |
| 2011/0220268 | A1 | 9/2011 | Nishio et al. | |
| 2017/0018472 | A1 | 1/2017 | Takamoto et al. | |
| 2019/0030648 | A1 | 1/2019 | Priewasser et al. | |
| 2019/0295894 | A1 | 9/2019 | Okita | |
| 2020/0017728 | A1 | 1/2020 | Matsubara et al. | |

FOREIGN PATENT DOCUMENTS

| | | | |
|---|---|---|---|
| CN | 112724888 | A | 4/2021 |
| JP | 2004-188475 | A | 7/2004 |
| JP | 2006-140311 | A | 6/2006 |
| JP | 2011-522411 | A | 7/2011 |
| JP | 2012-001615 | A | 1/2012 |
| JP | 2012-126789 | A | 7/2012 |
| JP | 2015-170754 | A | 9/2015 |
| JP | 2018-082131 | A | 5/2018 |
| JP | 2018-174220 | A | 11/2018 |
| JP | 2018-195663 | A | 12/2018 |
| JP | 2019-169686 | A | 10/2019 |
| JP | 2021-107879 | A | 7/2021 |
| TW | 202043416 | A | 12/2020 |
| WO | 2009/145526 | A2 | 12/2009 |
| WO | 2010/061782 | A1 | 6/2010 |

OTHER PUBLICATIONS

Written Opinion for PCT/JP2022/036777 dated Dec. 6, 2022.

Notice of Reasons for Refusal dated Oct. 31, 2025, issued in Japanese Application No. 2023-552851.

Communication dated Nov. 14, 2025, issued in Taiwanese Application No. 111137598.

Korean Office Action dated Mar. 19, 2026, issued in Korean application No. 10-2024-7004889.

* cited by examiner

PROTECTIVE SHEET, METHOD FOR PRODUCING ELECTRONIC COMPONENT, AND METHOD FOR PRODUCING GLASS PIECE FORMING DISPLAY SURFACE OF DISPLAY APPARATUS

CROSS-REFERENCE TO RELATED APPLICATION

This application is a National Stage of International Application No. PCT/JP2022/036777 filed Sep. 30, 2022, claiming priority based on Japanese Patent Application No. 2021-164163 filed Oct. 5, 2021 and Japanese Patent Application No. 2022-063384 filed Apr. 6, 2022, the disclosures of which are incorporated herein by reference in their entirety.

FIELD

The present invention relates to a protective sheet. Specifically, the present invention relates to a protective sheet for being attached to a protected surface of an electronic component having the protected surface, a protective sheet for being attached to one surface of a glass piece forming a display surface of a display apparatus, and a protective sheet for being attached to a glass plate for obtaining the glass piece. The present invention further relates to a method for producing the electronic component, and a method for producing the glass piece forming the display surface of the display apparatus.

BACKGROUND

Conventionally, semiconductor chips are known as electronic components. Such semiconductor chips are generally obtained by dividing a semiconductor wafer into individual dies by dicing (for example, Patent Literature 1 below). Patent Literature 1 discloses a semiconductor wafer including a semiconductor wafer body and a plurality of paired electrode parts on both surfaces of the semiconductor wafer body, in which the both surfaces of the semiconductor wafer body are formed to serve as circuit forming surfaces. Each of the circuit forming surfaces generally includes a plurality of circuits each including, for example, a wire and a device such as a transistor, and the semiconductor wafer body includes at least one pair of electrode parts for each circuit, which are respectively located on the circuit forming surfaces. Such a semiconductor wafer is diced to obtain a plurality of semiconductor chips each including a semiconductor chip body, in which each of both surfaces of the semiconductor chip body includes at least one circuit, and at least one pair of electrode parts are located respectively on both surfaces of the semiconductor chip body.

As disclosed in Patent Literature 1 below, the semiconductor chip as aforementioned is for example used with the electrode part on one surface (hereinafter referred to as first semiconductor chip electrode part) mounted on an electrode part of a circuit board (hereinafter referred to as circuit board electrode part) and the electrode part on the other surface (hereinafter referred to as second semiconductor chip electrode part) mounted on a first semiconductor chip electrode part of a different semiconductor chip.

As the electronic component, for example, a wafer level package (WLP) and an image sensor package are also known. The wafer level package includes a circuit board and a plurality of semiconductor packages mounted on the circuit board. The wafer level package as described above is generally divided into individual semiconductor packages by, for example, dicing. The image sensor package includes a sensor chip body with a circuit formed on its one surface, and a glass piece (cover glass) laminated on the one surface of the sensor chip body (i.e., the surface on which the circuit is formed) via an adhesive layer composed of, for example, an adhesive or glass frit. The image sensor package is generally obtained by, for example, dicing a layered product for image sensor package into individual image sensor packages each including at least one circuit, the layered product including: a sensor wafer body with a plurality of circuits formed on its one surface; and a glass plate having substantially the same dimension as that of the sensor wafer body in plan view and laminated on the one surface (i.e., the surface on which the plurality of circuits are formed) of the sensor wafer body via an adhesive layer composed of an adhesive, glass frit, or the like.

Further known is to divide a single glass plate into a plurality of glass pieces by, for example, dicing in order to obtain a glass piece for forming a display surface of a display apparatus.

CITATION LIST

Patent Literature

Patent Literature 1: JP 2015-170754 A

SUMMARY

Technical Problem

As described above, there are some cases where cutting a semiconductor wafer by dicing into a plurality of individual semiconductor chips causes portions of the semiconductor wafer near cut parts to be for example pulverized, resulting in minute foreign matters. The minute foreign matters can be generated similarly when the wafer level package is divided into individual semiconductor packages by dicing, when the layered product for image sensor package is divided into individual image sensor packages by dicing, and when a glass plate is divided into a plurality of individual glass pieces by dicing.

Such minute foreign matters may adhere to the surfaces of the electronic components such as the plurality of semiconductor chips, the plurality of semiconductor packages, and the plurality of image sensor packages as well as the surfaces of the plurality of glass pieces, and a large number of the minute foreign matters may remain on these surfaces.

A large number of the minute foreign matters remaining on the surfaces of the plurality of semiconductor chips are likely to degrade operation reliability of the circuits formed on the surfaces of the plurality of semiconductor chips, which is not preferable.

In the case where the surface of each of the plurality of semiconductor packages is formed of one surface of a glass piece, a large number of the minute foreign matters remaining on the surface of each of the plurality of semiconductor packages may change the transmittance of the glass piece in each of the plurality of semiconductor packages. Further, in the case where a large number of the foreign matters remain on the surfaces of the plurality of image sensor packages (i.e., surfaces of glass pieces) and the surfaces of the plurality of glass pieces, the minute foreign matters remaining thereon may change the transmittance of each of the glass pieces.

The plurality of semiconductor packages need to be inspected for their internal wiring connection and the like before shipment. For this inspection, an image of the inside of each of the plurality of semiconductor packages need to be captured through the glass piece using, for example, a camera. However, when the transmittance of the glass piece is changed as described above, there is a likelihood of failing to obtain images of the plurality of semiconductor packages clear enough to enable examination of their internal wiring connection.

Although the image sensor package is used as an image sensor for a camera and the like, there is a likelihood of failing to capture a sufficiently clear image of an imaged object when the transmittance of the glass piece is changed as described above.

Further, there is a likelihood of failing to display a clear image on the display surface of the display apparatus when the glass piece with its transmittance changed as described above is used to form the display surface of the display apparatus.

In the semiconductor chip as disclosed in Patent Literature 1, when the first semiconductor chip electrode part and the second semiconductor chip electrode part are, for example, mounted to be flush with the respective surfaces of the semiconductor chip, a large number of the minute foreign matters remaining on the surfaces may cause insufficient close contact of the first semiconductor chip electrode part of one semiconductor chip with the circuit board electrode part, or cause insufficient close contact of the second semiconductor chip electrode part of the one semiconductor chip with the first semiconductor chip electrode part of the different semiconductor chip. In such a case, bonding defect occurs between electrodes and no sufficient electrical reliability can be achieved, which is not preferable.

The problems as above are applicable not only to some specific semiconductor chips but also to any semiconductor chips. The problems as above are similarly applicable to those electronic components other than the semiconductor chips obtained through a process involving, for example, cutting such as dicing. For example, the same problems as above arise when a connected circuit board formed of a plurality of circuit boards connected to each other is divided into individual circuit boards.

However, no sufficient consideration seems to have been made on suppressing a large number of minute foreign matters from remaining on a surface to be protected (hereinafter referred to also as protected surface) of an electronic component. Further, no sufficient consideration seems to have been made also on suppressing a large number of minute foreign matters from remaining on one surface of the glass piece forming the display surface of the display apparatus.

It is therefore an object of the present invention to provide a protective sheet capable of suppressing a large number of minute foreign matters from remaining on a protected surface of an electronic component having the protected surface and one surface of a glass piece forming a display surface of a display apparatus. It is also an object of the present invention to provide a method for producing the electronic component using the protective sheet as described above, and a method for producing the glass piece forming the display surface of the display apparatus.

Solution to Problem

A protective sheet according to the present invention is a protective sheet for being attached to a protected surface of an electronic component having the protected surface, one surface of a glass piece forming a display surface of a display apparatus, or one surface of a glass plate for obtaining the glass piece, the protective sheet including: a protective layer for being attached to the protected surface of the electronic component, the one surface of the glass piece, or the one surface of the glass plate, in which the protective layer is made of one of a water-soluble resin composition and a curable resin composition with its adhesiveness reducible by curing reaction.

A method for producing an electronic component according to the present invention includes: a protective sheet attaching step of attaching a protective sheet to a connected electronic component product including a plurality of the electronic components that have protected surfaces and are connected to each other with the protected surfaces facing in a same direction, so as to protect the protected surfaces of the plurality of electronic components: a connected electronic component product dividing step of dividing the connected electronic component product with the protective sheet attached into pieces with spaces therebetween in a plane direction to obtain the plurality of electronic components to which divided pieces of the protective sheet are respectively attached; and a protective sheet removing step of removing the divided pieces of the protective sheet respectively from the plurality of electronic components, in which the protective sheet includes a protective layer for being attached to the protected surfaces, and the protective layer is made of one of a water-soluble resin composition and a curable resin composition with its adhesiveness reducible by curing reaction.

A method for producing a glass piece for a display surface of a display apparatus according to the present invention includes: a protective sheet attaching step of attaching a protective sheet to one surface of a glass plate for obtaining the glass piece for forming the display surface of the display apparatus so as to protect the one surface; a glass plate dividing step of dividing the glass plate with the protective sheet attached into pieces with spaces therebetween in a plane direction to obtain a plurality of the glass pieces to which divided pieces of the protective sheet are respectively attached; a protective sheet removing step of removing the divided pieces of the protective sheet respectively from the plurality of glass pieces, in which the protective sheet includes a protective layer for being attached to one surface of the glass plate or one surface of each of the plurality of glass pieces, and the protective layer is made of one of a water-soluble resin composition and a curable resin composition with its adhesiveness reducible by curing reaction.

DESCRIPTION OF EMBODIMENTS

Hereinafter, an embodiment of the present invention will be described.

[Protective Sheet]

A protective sheet 10 according to this embodiment is a protective sheet for being attached to a protected surface of an electronic component having the protected surface, one surface of a glass piece forming a display surface of a display apparatus, or one surface of a glass plate for obtaining the glass piece. The protective sheet 10 according to this embodiment includes a protective layer for being attached to the protected surface of the electronic component, the one surface of the glass piece, or the one surface of the glass plate. In the protective sheet 10 according to this embodiment, the protective layer is made of one of a water-soluble resin composition and a curable resin composition with its adhesiveness reducible by curing reaction. Examples of the electronic component include a semiconductor wafer, a semiconductor chip, a circuit board, and a connected circuit board formed of a plurality of the circuit boards connected to each other.

Examples of the electronic component further include a pseudo wafer including a support substrate and a package formed by collectively resin-sealing a plurality of semiconductor chips disposed on the support substrate. The pseudo wafer can be the package removed from the support substrate. A rewiring layer can be formed on at least one surface of the pseudo wafer, in which case the protective layer can be used to protect the rewiring layer. Further, examples of the electronic component include a divided pseudo wafer product in which the pseudo wafer is divided into constituent units each including at least one semiconductor chip.

Figure 1:
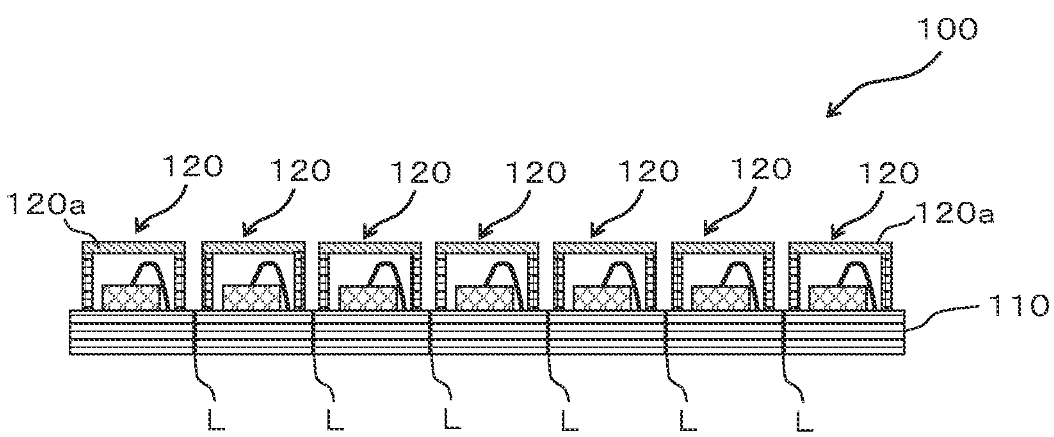
FIG. 1 is a schematic cross-sectional view showing a configuration of a wafer level package.
Figure 2A:
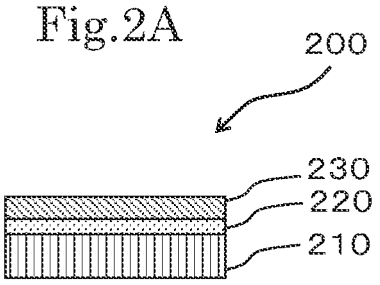
FIG. 2A is a schematic cross-sectional view showing a configuration of an image sensor package.

Examples of the electronic component further include a wafer level package (WLP) as shown in FIG. 1 and an image sensor package as shown in FIG. 2A.

As shown in FIG. 1, a wafer level package 100 includes a circuit board 110 and a plurality of semiconductor packages 120 mounted on the circuit board 110. That is, in the wafer level package 100, each of the plurality of semiconductor chips 120 is separately resin-sealed on the circuit board 110. The wafer level package 100 can be configured such that a surface of each of the plurality of semiconducting packages 120 (i.e., surface opposite to the surface attached to the circuit board 110) is formed of one surface of a glass piece *120a*. That is, the wafer level package 100 can be configured such that each of the plurality of semiconductor packages 120 includes the glass piece *120a* on its surface side (i.e., on a surface side opposite to the surface attached to the circuit board 110). When the wafer level package 100 is thus formed, the protective layer is used to protect the one surface of the glass piece *120a* in each of the plurality of semiconductor packages 120. The wafer level package 100 is divided (cut) by, for example, dicing along cutting lines L as shown in FIG. 1 into individual semiconductor packages.

Figure 2B:
FIG. 2B is a schematic cross-sectional view showing a configuration of a layered product for image sensor package.
Figure 2B:
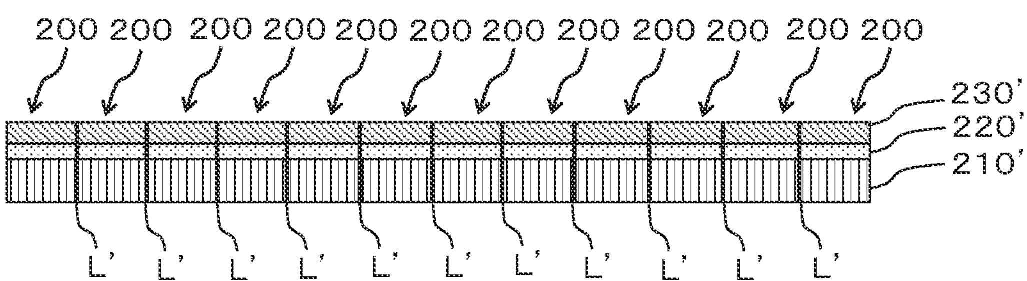

As shown in FIG. 2A, an image sensor package 200 includes a sensor chip body 210 with a circuit formed on its one surface, and a glass piece 230 (cover glass) laminated on the one surface of the sensor chip body 210 (i.e., the surface on which the circuit is formed) via an adhesive layer 220 composed of, for example, an adhesive or glass frit. The image sensor package 200 is used as, for example, an image sensor for a camera and the like. In the image sensor package 200 configured as above, the protective layer is used to protect a surface of the glass piece 230 (i.e., surface opposite to a side of the sensor chip body 210) laminated on the sensor chip body 210. As shown in FIG. 2B, the image sensor package 200 is generally obtained by, for example, dicing a layered product 200' for image sensor package into the individual image sensor packages 200 each including at least one circuit, the layered product 200' including: a sensor wafer body 210' with a plurality of circuits formed on its one surface; and a glass plate 230' having substantially the same dimension as that of the sensor wafer body 210' in plan view and laminated on the one surface (i.e., the surface on which the plurality of circuits are formed) of the sensor wafer body 210' via an adhesive layer 220' composed of an adhesive, glass frit, or the like. Specifically, the image sensor package 200 is obtained by, for example, dicing along cutting lines L' as shown in FIG. 2B into the individual image sensor packages 200.

The semiconductor chip generally includes a semiconductor chip body and an electrode part disposed on at least one surface of the semiconductor chip body for electrical connection to an electrode part of another member. The semiconductor chip has at least one surface serving as a circuit forming surface on which a circuit is formed. Examples of the other member include a circuit board, and other semiconductor chips configured in the same manner as the semiconductor chip. Examples of the semiconductor chip include a TSV (Through Silicon Via) type chip including a pair of electrode parts disposed respectively on both surfaces of the semiconductor chip body for electrical connection to the other members, and a conductive part passing through the semiconductor chip body in its thickness direction to allow the pair of electrode parts to be electrically conducted to each other. The TSV type semiconductor chip can have only one surface serving as a circuit forming surface, or can have both surfaces serving as circuit forming surfaces. Examples of the semiconductor chip further include a sensor chip in which the circuit includes a sensor element (e.g., a light-receiving element or a vibrating element) as an element. Examples of the sensor chip include a CMOS (Complementary Metal-Oxide Semiconductor) chip and an MEMS (Micro Electro Mechanical Systems) chip.

Examples of the display apparatus include a liquid crystal display apparatus, a plasma display apparatus, and an organic EL display apparatus. The liquid crystal display apparatus, the plasma display apparatus, and the organic EL display apparatus can be a color display apparatus, can be a character display apparatus, or can be a graphic display apparatus.

Figure 3:
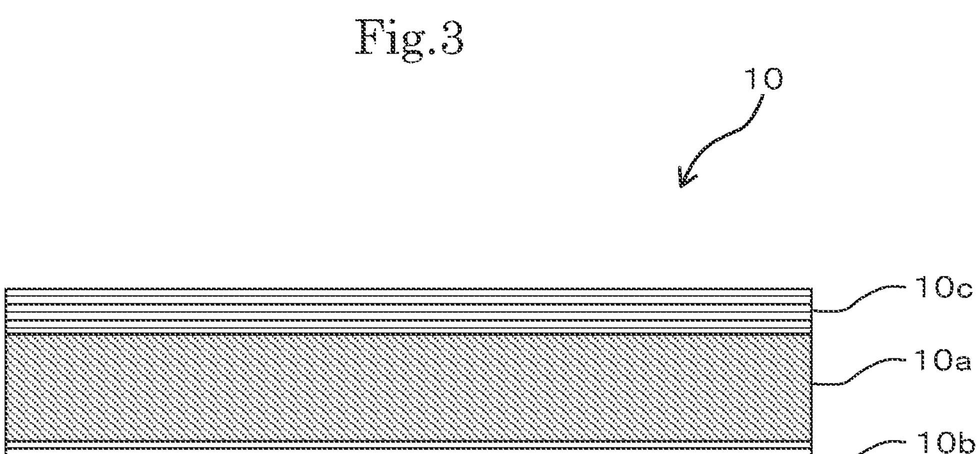
FIG. 3 is a schematic cross-sectional view showing a configuration of a protective sheet according to one embodiment of the present invention.

As shown in FIG. 3, the protective sheet 10 according to this embodiment includes a protective layer 10*a*, a first release liner 10*b* on one surface of the protective layer 10*a*, and a second release liner 10*c* on the other surface of the protective layer 10*a* (i.e., the surface opposite to the one surface). That is, the protective sheet 10 according to this embodiment has the protective layer 10*a* sandwiched between the pair of release liners (i.e., first release liner 10*b* and second release liner 10*c*) from both surface sides. In the protective sheet 10 according to this embodiment, the protective layer 10*a* is to be attached to the protected surface of the electronic component having the protected surface, one surface of the glass piece forming the display surface of the display apparatus, or one surface of the glass plate for obtaining the glass piece.

The protective sheet 10 can be fabricated by, for example, applying a water-soluble resin composition including excess liquid or a curable resin composition including excess liquid and having its adhesiveness reducible by curing reaction to the first release liner 10*b* into a certain thickness (e.g., 10 μm) using, for example, an applicator, and allowing the composition to dry at a certain temperature for a certain period of time (e.g., at 110° C. for 2 minutes) to form the protective layer 10*a* on the first release liner 10*a*, followed by attaching the second release liner 10*c* to the opposite surface to the surface of the protective layer 10*a* to which the first release liner 10*b* is attached.

In the example shown in FIG. 3, the protective sheet 10 has the protective layer 10*a* sandwiched between the pair of release liners (i.e., first release liner 10*b* and second release liner 10*c*) from the both surface sides, but the configuration of the protective sheet 10 is not limited thereto. The configuration can be such that the protective sheet 10 is composed only of the protective layer 10*a*, or has only one of the first release liner 10*b* or the second release liner 10*c* on one surface of the protective layer 10*a*. In short, it is enough for the protective sheet 10 to only include at least the protective layer 10*a*.

A description will be hereinafter given by taking the protective layer 10*a* made of a water-soluble resin composition as an example of the protective sheet 10 according to a first embodiment, and the protective layer 10*a* made of a curable resin composition with its adhesiveness reducible by curing reaction as an example of the protective sheet 10 according to a second embodiment.

First Embodiment

In the protective sheet 10 according to the first embodiment, the protective layer 10*a* is made of a water-soluble resin composition. The water-soluble resin composition includes a water-soluble polymer compound. In the protective sheet 10 according to the first embodiment, the protective layer 10*a* is formed by, for example, applying the water-soluble resin composition including excess liquid to the release liner and allowing it to dry. In the protective sheet 10 according to the first embodiment, it is preferable that a composition formed of the water-soluble polymer compound dispersed in water (hereinafter referred to as a first protective layer forming composition) be used as the water-soluble resin composition including excess liquid. In the first protective layer forming composition, the water-soluble polymer compound is included in an amount of preferably 5 mass parts or more and 80 mass parts or less, more preferably 10 mass parts or more and 70 mass parts or less, further preferably 15 mass parts or more and 60 mass parts or less, based on 100 mass parts of water. In the first protective layer forming composition, it is preferable that the water-soluble polymer compound be dissolved in water. In the first protective layer forming composition, the water-soluble polymer compound can be dissolved in water by being heated at a temperature of 20° C. to 90° C. Further, the first protective layer forming composition has a viscosity at 25° C. of preferably 0.03 Pa·s or more, more preferably 0.05 Pa·s or more, further preferably 0.1 Pa·s or more. The first protective layer forming composition having a viscosity at 25° C. of the abovementioned lower limit or higher can relatively suppress the thickness of the protective layer 10*a* from varying when the first protective layer forming composition is applied to the release liner to form the protective layer 10*a* on the release liner. The first protective layer forming composition has a viscosity at 25° C. of preferably 15 Pa·s or less, more preferably 10 Pa·s or less, further preferably 5 Pa·s or less. The first protective layer forming composition having a viscosity at 25° C. of the abovementioned upper limit or lower can have an improved applicability when being applied to the release liner. The viscosity of the first protective layer forming composition at 25° C. can be measured using, as a measuring apparatus, a digital viscometer manufactured by EKO INSTRUMENTS CO., LTD. (product name "DV-I Prime") and using a LV-3 spindle under the condition of the rotation speed of 50 rpm.

Examples of the water-soluble polymer compound include polyvinyl alcohol (PVA), polyvinylpyrrolidone (PVP), a water-soluble polyester (PES), and polyethylene oxide (PEO). As the water-soluble polymer compound, polyvinyl alcohol, polyvinylpyrrolidone, a water-soluble polyester, polyethylene oxide, and the like can be individually used, or a combination of these can be used. As the water-soluble polymer compound, at least one selected from the group consisting of polyvinyl alcohol, a water-soluble polyester, and polyethylene oxide is preferably used.

The polyvinyl alcohol has a saponification degree of preferably 50 or more and 98 or less, more preferably 60 or more and 90 or less. The polyvinyl alcohol having a saponification degree within the abovementioned numerical range can exhibit sufficient water solubility, and can improve the workability of applying the first protective layer forming composition to the release liner when the polyvinyl alcohol is included in the first protective layer forming composition. The saponification degree of the polyvinyl alcohol can be measured by proton nuclear magnetic resonance spectroscopy ($^1$H-NMR method). When an additive is included in a measurement sample and a peak derived from the additive overlaps a peak used for calculating the saponification degree, the saponification degree of the polyvinyl alcohol is measured after the measurement sample is subjected to, for example, methanol extraction to separate the additive therefrom. The saponification degree of the polyvinyl alcohol can be measured under the following conditions.

<Measurement Conditions>

Analyzer FT-NMR: Bruker Biospin, AVANCE III-400

Observed frequency: 400 MHZ (1H)

Measurement solvent: Heavy water or heavy dimethyl sulfoxide (heavy DMSO)

Measurement temperature: 80° C.

Chemical shift reference: External standard TSP-d4 (0.00 ppm) (when measured with heavy water)

Measurement solvent (2.50 ppm) (when measured with heavy DMSO)

The saponification degree of the polyvinyl alcohol is calculated based on the following equation, using a peak derived from a methylene group of a vinyl alcohol unit (VOH) (heavy water; 2.0 to 1.0 ppm, heavy DMSO; 1.9 to 1.0 ppm) and a peak derived from an acetyl group of a vinyl acetate unit (VAc) (heavy water; about 2.1 ppm, heavy DMSO; about 2.0 ppm). In the following equation, [VOH (—$CH_2$)—] means the intensity of the peak derived from —$CH_2$— in the vinyl alcohol unit, and [VAc($CH_3CO$—)] means the peak intensity derived from $CH_3CO$— in the vinyl acetate unit.

$$\text{Saponification degree} = \frac{[VOH(-CH_2-)/2]}{[VAc(CH_3CO-)/3] + [VOH(-CH_2-)/2]} \times 100$$

The polyvinyl alcohol has an average polymerization degree of preferably 100 or more and 1000 or less, more preferably 100 or more and 800 or less. The polyvinyl alcohol having an average polymerization degree within the abovementioned numerical range can exhibit sufficient water solubility, and can improve the workability of applying the first protective layer forming composition to the release liner when the polyvinyl alcohol is included in the first protective layer forming composition. The average polymerization degree of the polyvinyl alcohol can be measured by aqueous GPC. The average polymerization degree of the polyvinyl alcohol can be measured under the conditions as follows:

<Measurement Conditions>

Analyzer: Agilent, 1260 Infinity

Columns: TSKgel G6000PWXL (manufactured by Tosoh Corporation) and TSKgel G3000PWXL (manufactured by Tosoh Corporation)

The above two columns are connected in series.

Column temperature: 40° C.

Eluent: 0.2 M aqueous sodium nitrate solution

Injection volume: 100 μL

Detector: Differential refractometer (RI)

Standard samples: PEG standard sample and PVA standard sample

Specific measurements are performed as follows:

(1) Calculate a mass average molecular weight Mw of each of a sample to be measured (PVA) and the PVA standard sample by GPC measurement using the PEG standard sample. The PVA standard sample has a known average polymerization degree.

(2) Prepare a calibration curve using the average polymerization degree of the PVA standard sample and the calculated mass average molecular weight Mw of the PVA standard sample.

(3) Using the prepared calibration curve, determine the average polymerization degree of the sample to be measured (PVA) from the mass average molecular weight Mw of the sample to be measured (PVA).

When the polyvinyl alcohol is used as the water-soluble polymer, a plurality of polyvinyl alcohols having different saponification degrees can be used in combination, or a plurality of polyvinyl alcohols having different average polymerization degrees can be used in combination.

The water-soluble polyester has residues of polycarboxylic acid and residues of polyol. The water-soluble polyester is a polymerization product of, for example, a monomeric component including a polycarboxylic acid component and a polyol component. It can be determined based on the common technical knowledge that the water-soluble polyester has water solubility.

The water-soluble polyester preferably meets at least one of (1) to (4) below:

(1) When water at ordinary temperature (23±2° C.) is sprayed at a spray pressure of 0.005 MPa on the entire surface of a thin film of the water-soluble polyester having a thickness of 20 μm for 20 minutes, the thin film entirely dissolves in water.

(2) When water at 50° C. is sprayed at a spray pressure of 0.005 MPa on the entire surface of a thin film of the water-soluble polyester having a thickness of 20 μm for 10 minutes, the thin film entirely dissolves in water.

(3) When the water-soluble polyester and ordinary temperature water are mixed at a mass ratio between the water-soluble polyester and ordinary temperature water of 1:5 to obtain a mixed liquid and the mixed liquid is irradiated with ultrasonic waves for 20 minutes, the entire water-soluble polyester dissolves in water.

(4) When the water-soluble polyester and 50° C. water are mixed at a mass ratio between the water-soluble polyester and 50° C. water being 1:5 to obtain a mixed liquid and the mixed liquid is irradiated with ultrasonic waves for 10 minutes, the entire water-soluble polyester dissolves in water.

The water-soluble polyester preferably has a mass average molecular weight Mw of 40,000 (40 thousand) or less.

The first protective layer forming composition including the water-soluble polyester with the mass average molecular weight Mw within the above numerical range facilitates forming the protective layer 10*a* in a film shape. When the protective layer 10*a* in such a film shape is disposed on the protected surface of the electronic component or one surface of the glass piece forming the display surface of the display apparatus, the protective layer 10*a* sufficiently suppresses minute foreign matters from adhering to the protected surface or the one surface of the glass piece. The protective layer 10*a* including the water-soluble polyester with the mass average molecular weight Mw within the above numerical range has excellent water solubility. In terms of making the protective layer 10*a* excellent in durability to water at a relatively low temperature of 30° C. or less (hereinafter referred to also as durability to low temperature water), the water-soluble polyester preferably has a mass average molecular weight Mw of 15,000 (15 thousand) or more. The protective layer 10*a* including the water-soluble polyester with the mass average molecular weight Mw within the above numerical range has excellent durability to low temperature water, and is thus hardly removed from the protected surface of the electronic component or the one surface of the glass piece forming the display surface of the display apparatus when the protective layer 10*a* is in contact with water at a relatively low temperature of 30° C. or less. In contrast, the protective layer 10*a* is easily removed from the protected surface of the electronic component or the one surface of the glass piece forming the display surface of the display apparatus when the protective layer 10*a* is in contact with water at a relatively high temperature of 40° C. or more (warm water) (i.e., the protective layer 10*a* decreases its durability to high temperature water). Thus, in the case, for example, where a semiconductor wafer having the protective layer 10*a* attached to one surface thereof is blade-diced while being washed with water at a relatively low temperature of 30° C. or less, the protective layer 10*a* is sufficiently fixed to the one surface of the semiconductor wafer to enable sufficient protection of the one surface. On the other hand, a plurality of individual semiconductor chips obtained by blade-dicing the semiconductor wafer are washed with warm water at 40° C. or more to enable the individual pieces of the protective layer 10*a* to be easily removed respectively from the plurality of semiconductor chips. The same effects as those above can be obtained when a connected circuit board is diced to obtain circuit boards, when a pseudo wafer is diced to obtain a divided pseudo wafer product, when a wafer level package is divided into individual semiconductor packages, and when a layered product for image sensor package is diced and divided into individual image sensor packages. Further, the same effects as those above can be obtained when a glass plate for obtaining a glass piece is diced into a plurality of glass pieces to obtain the glass piece forming the display surface of the display apparatus.

Use of a water-soluble polyester having a high acid value as the water-soluble polyester also enables the protective layer 10*a* to have excellent durability to low temperature water and low durability to high temperature water. In such a case, the acid value of the water-soluble polyester is preferably 10 mgKOH/g or more, more preferably 20 mgKOH/g or more, further preferably 30 mgKOH/g or more, still more preferably 40 mgKOH/g or more. The upper limit of the acid value of the water-soluble polyester is generally 70 mgKOH/g. The acid value is determined by the neutralization titration method specified in JIS K 0070-1992. Further, when the water-soluble polyester has a high acid value as described above, the mass average molecular weight Mw of the water-soluble polyester is preferably 10,000 (10 thousand) or less, more preferably 7.000 or less, further preferably 4,000 or less. The water-soluble polyester having a high acid value and having the mass average molecular weight Mw within the above numerical range allows the protective layer 10*a* to have more excellent durability to low temperature water and lower durability to high temperature water. When about 0.1 mol/L ammonia water is used as a cleaning liquid for the protective layer 10*a*, the ammonia water even at a low temperature (30° C. or less) can relatively easily remove the protective layer 10*a* from the protected surface or the one surface of the glass piece forming the display surface of the display apparatus.

The polyethylene oxide preferably has a mass average molecular weight Mw of 1,000,000 (1 million) or less. The polyethylene oxide preferably has a mass average molecular weight Mw of 20,000 (20 thousand) or more. The first protective layer forming composition for forming the protective layer 10*a* includes the polyethylene oxide having the mass average molecular weight Mw within the above numerical range, and can thereby have suitable viscosity. This configuration allows the protective layer 10*a* to be easily formed using the first protective layer forming composition (i.e., increases film-forming performance). The first protective layer forming composition having a mass average molecular weight of more than 1,000,000 has a relatively high viscosity and tends to be hardly spread at the time of forming the protective layer 10*a* while the first protective layer forming composition having a mass average molecular weight of less than 20,000 has a relatively low viscosity and tends to hardly allow the protective layer 10 to have a desired thickness at the time of forming the protective layer 10*a*. That is, the first protective layer forming composition as above tends to have low film-forming performance. The protective layer 10*a* including the polyethylene oxide with the mass average molecular weight Mw within the above numerical range can be relatively easily removed by being washed with water from the protected surface of the electronic component or the one surface of the glass piece forming the display surface of the display apparatus.

The mass average molecular weight Mw of each of the water-soluble polyester and the polyethylene oxide can be measured by GPC in the same manner as described in the average polymerization degree of the polyvinyl alcohol. As the eluent, however, 0.2 M aqueous sodium nitrate solution or DMF (dimethylformamide), whichever is appropriate for the composition of an object to be measured, is selected. Specifically, an eluent capable of dissolving the object to be measured is appropriately selected as the eluent.

In the protective sheet 10 according to the first embodiment, the protective layer 10*a* has a close contact force to a bare wafer of preferably 0.05 N/100 mm or more, more preferably 0.5 N/100 mm or more, further preferably 5.0 N/100 mm or more. Even when an object to which the protective sheet 10 is to be attached is a semiconductor wafer having electrode parts on its both surfaces or a semiconductor chip obtained by cutting the semiconductor wafer (specifically, a semiconductor chip having electrode parts on its both surface), the protective layer 10*a* having the close contact force to the bare wafer of the above lower limit or more allows the protective sheet 10 to be sufficiently brought into close contact with the object, and can also suppress the protective sheet 10 from being removed from the semiconductor wafer or the semiconductor chip as the object in a fragile part forming step and a semiconductor wafer cutting step, which will be described later. Although, in the fragile part forming step, the semiconductor wafer to which the protective sheet 10 is attached is irradiated with laser beams from a side of the protective sheet 10 to thereby form a fragile part in the semiconductor wafer as will be described later, the configuration that can suppress the protective sheet 10 from being removed from the semiconductor wafer as described above enables the surface of the protective sheet 10 as the laser irradiation surface to be kept in a relatively flat state. This enables leaser irradiation to be directed at the relatively flat surface. Since the protective sheet 10 can be suppressed from being removed from the semiconductor wafer, a defect is hardly generated starting from a portion in which the protective sheet 10 is removed from the semiconductor wafer, and foreign matters can be suppressed from reaching the surface of the semiconductor wafer from the outside of the protective sheet 10 through the defect to adhere to the surface of the semiconductor wafer. Further, in the protective sheet 10 according to the first embodiment, the protective layer 10*a* has a close contact force to the bare wafer of preferably 200 N/100 mm or less, more preferably 150 N/100 mm or less, further preferably 100 N/100 mm or less.

The close contact force of the protective layer 10*a* to the bare wafer can be measured as follows. Hereinafter, a description will be given on the measurement method by taking the protective sheet 10 configured as shown in FIG. 3 as an example.

(1) Remove one release liner (first release liner 10*b*) from the protective layer 10*a* to have one surface of the protective layer 10*a* exposed, and attach a lining tape to the exposed surface (first exposed surface) to obtain a first test piece. The lining tape is attached to the first exposed surface at a temperature of 25° C. using a hand roller.

(2) After the first test piece is cut to have a width of 100 mm, remove the other release liner (second release liner 10*c*) of the protective layer 10*a* to have the other surface of the protective layer 10*a* exposed, and attach the exposed surface (second exposed surface) to a bare wafer to obtain a second test piece (measurement sample). The second exposed surface is attached to the bare wafer at a temperature of 90° C. and at 10 mm/see using a 2 kg standard roller (manual adhesion test press wheel adhesive tape adhesion tester). After the attaching, the obtained product is naturally cooled for 20 minutes or more.

(3) Under the atmosphere at 23° C., measure a release force of the measurement sample at a releasing angle of 180° and at a releasing speed of 300 mm/min. The measured release force is regarded as close contact force. As a measuring apparatus, for example, an autograph (manufactured by Shimadzu Corporation) can be used.

In the protective sheet 10 according to the first embodiment, the protective layer 10*a* has a breaking strength at −15° C. of preferably 200 MPa or less, more preferably 100 MPa or less, further preferably 50 MPa or less. In the protective sheet 10 according to the first embodiment, the protective layer 10*a* has a breaking strength at −15° C. of preferably 0.01 MPa or more, more preferably 0.05 MPa or more, further preferably 0.1 MPa or more. Further, in the protective sheet 10 according to the first embodiment, the protective layer 10*a* has an elongation at break at −15° C. of preferably 100% or less, more preferably 80% or less, further preferably 50% or less. In the protective sheet 10 according to the first embodiment, the protective layer 10*a* has an elongation at break at −15° C. of preferably 0.1% or more, more preferably 0.3% or more, further preferably 0.5% or more. The protective layer 10*a* having the breaking strength and the elongation at break at −15° C. within the above respective numerical ranges can be more sufficiently cut when the protective layer 10*a* attached to the surface of the semiconductor wafer is cut together with the semiconductor wafer into individual pieces under low temperature conditions (e.g., is subjected to cool expanding).

The breaking strength at −15° C. and the elongation at break at −15° C. can be measured as follows. For the elongation at break at −15° C. specifically, the protective layer 10*a* having a length of 50 mm, a width of 10 mm, and a thickness of 30 μm as the test piece is pulled in a length direction at a temperature of −15° C., at a distance between chucks of 20 mm (i.e., measured length: $L_0$), and at a tensile speed of 10 mm/sec, using a tensile tester (autograph AG-IS manufactured by Shimadzu Corporation), to measure the length of the test piece when the test piece breaks (i.e., value $L_1$ obtained by adding the elongation amount to the measured length $L_0$). Then, the elongation at break at −15° C. is calculated based on the equation below:

$$\text{Elongation at break } E = (L_1 - L_0)/L_0 \times 100$$

Further, the breaking strength at −15° C. can be determined by measuring a force applied to the test piece when broken when the tensile test is performed using the above test piece and the above tensile tester.

In the protective sheet 10 according to the first embodiment, the protective layer 10*a* has a tensile storage elastic modulus at −15° C. of preferably 1 GPa or more and 30 GPa or less, more preferably 2 GPa or more and 20 GPa or less, further preferably 3 GPa or more and 15 GPa or less. The protective layer 10*a* having the tensile storage elastic modulus at −15° C. within the above numerical range can be more sufficiently cut when the protective layer 10*a* attached to the surface of the semiconductor wafer is cut together with the semiconductor wafer into individual pieces under low temperature conditions (e.g., is subjected to cool expanding). In the protective sheet 10 according to the first embodiment, the protective layer 10*a* has a tensile storage elastic modulus at 25° C. of preferably 0.1 MPa or more and 20 GPa or less, more preferably 0.5 MPa or more and 15 GPa or less, further preferably 1 MPa or more and 10 GPa or less. Since the protective sheet 10 is attached to the semiconductor wafer generally at a temperature of about 25° C., the protective layer 10*a* having the tensile storage elastic modulus at 25° C. within the above numerical range can be relatively easily attached to the semiconductor wafer, and can be easily subjected to slit processing when such slit processing is required for the protective layer 10*a*. The protective layer 10*a* having the tensile storage elastic modulus at 25° C. within the above numerical range can be suppressed from being excessively deformed at a temperature of about 25° C. when the semiconductor wafer to which the protective sheet 10 is attached is used to produce the plurality of individual semiconductor chips. Further, the protective layer 10*a* having the tensile storage elastic modulus at 25° C. within the above numerical range can sufficiently protect the semiconductor wafer or the semiconductor chips from external impacts when the protective sheet 10 is attached to the semiconductor wafer or the semiconductor chips. The same effects as those above can be obtained when a connected circuit board is diced to obtain circuit boards, when a pseudo wafer is diced to obtain a divided pseudo wafer product, when a wafer level package is divided into individual semiconductor packages, and when a layered product for image sensor package is diced and divided into individual image sensor packages. The same effects as those above can also be obtained when a glass plate for obtaining a glass piece is divided into a plurality of individual glass pieces by dicing to obtain the glass piece forming the display surface of the display apparatus.

The tensile storage elastic moduli at −15° C. and 25° C. each refer to the value measured as follows. Specifically, the protective layer 10*a* having a length of 40 mm, a width of 10 mm, and a thickness of 50 μm is used as the test piece to measure the tensile storage elastic modulus of the test piece in a temperature range of −40° C. to 80° C. at a frequency of 1 Hz, a strain amount of 0.1%, a temperature rising rate of 10° C./min. and a distance between chucks of 20 mm, using a solid viscoelasticity measuring instrument (e.g., model RSAIII manufactured by TA Instruments). In so doing, the tensile storage elastic modulus at −15° C. can be obtained by reading the value at −15° C., and the tensile storage elastic modulus at 25° C. can be obtained by reading the value at 25° C.'. The measurement is performed by pulling the test piece in its length direction.

In the protective sheet 10 according to the first embodiment, the protective layer 10*a* has a surface free energy of preferably 25 mJ/m$^2$ or more and 85 mJ/m$^2$ or less, more preferably 35 mJ/m$^2$ or more and 75 mJ/m$^2$ or less. In the protective layer 10*a* both the surface with which the first release liner 10*b* is in abutting contact and the surface with which the second release liner 10*c* is in abutting contact preferably have the surface free energies within the above numerical range. The protective layer 10*a* having the surface free energies on both surface sides within the above numerical range facilitates control of close contact force to the first release liner 10*b* and the second release liner 10*c*. Further, at least the surface of the protective layer 10*a* for being attached to the semiconductor wafer (e.g., the surface in abutting contact with the first release liner 10*b*) having the surface free energy within the above numerical range can relatively increase close contactability to the semiconductor wafer. This allows the protective sheet 10 to be hardly released from the surface of the semiconductor wafer when the semiconductor wafer with the protective sheet 10 attached thereto is used to produce the plurality of individual semiconductor chips, thus being capable of increasing process stability.

The surface free energy can be measured as follows. First, contact angles of a water droplet ($H_2O$) and a droplet of iodide methylene ($CH_2I_2$), which are in contact with the surface of the protective layer 10*a*, are respectively measured using a contact angle meter, at a temperature of 20° C. and a relative humidity of 65% RH. Next, the surface free energy is calculated as follows from the measured value of the contact angle θw of the water droplet and the measured value of the contact angle θi of the droplet of methylene iodide. Specifically, $\gamma s^d$ (dispersion component of the surface free energy) and $\gamma s^h$ (polar component of the surface free energy) are obtained according to the method by Owens et al. in the Journal of Applied Polymer Science, vol. 13, p1741-1747 (1969). Then, the value γs obtained as the sum of $\gamma s^d$ and $\gamma s^h$ ($\gamma s = \gamma s^d + \gamma s^h$) is the surface free energy of the protective layer 10*a*. The values of $\gamma s^d$ (dispersion component) and $\gamma s^h$ (polar component) are obtained respectively as solutions to the binary system of equations (1) and (2) below:

$$1+\cos\theta w = 2\sqrt{\gamma s^d}\times\frac{\sqrt{\gamma w^d}}{\gamma w}+2\sqrt{\gamma s^h}\times\frac{\sqrt{\gamma w^h}}{\gamma w} \quad (1)$$

$$1+\cos\theta i = 2\sqrt{\gamma s^d}\times\frac{\sqrt{\gamma i^d}}{\gamma i}+2\sqrt{\gamma s^h}\times\frac{\sqrt{\gamma i^h}}{\gamma i} \quad (2)$$

In the equations (1) and (2), γw represents the surface free energy of water, $\gamma w^d$ represents the dispersion component of the surface free energy of water, $\gamma w^h$ represents the polar component of the surface free energy of water, γi represents the surface free energy of methylene iodide, $\gamma i^d$ represents the dispersion component of the surface free energy of methylene iodide, and $\gamma i^h$ represents the polar component of the surface free energy of methylene iodide, which are known values as follows:

$$\gamma w = 72.8[\mathrm{mJ/m^2}]$$

$$\gamma w^d = 21.8[\mathrm{mJ/m^2}]$$

$$\gamma w^h = 51.0[\mathrm{mJ/m^2}]$$

$$\gamma i = 50.8[\mathrm{mJ/m^2}]$$

$$\gamma i^d = 48.5[\mathrm{mJ/m^2}]$$

$$\gamma i^h = 2.3[\mathrm{mJ/m^2}]$$

Specifically, the surface free energy is measured for one surface (i.e., surface attached to the semiconductor wafer) of the protective layer 10*a*. The contact angle of each of the water droplet and the droplet of methylene iodide is measured and an average of five measured values is taken. The contact angle is obtained by dropping 1 mL liquid on the one surface and measuring its contact angle within 5 seconds. The dispersion component and the polar component are calculated from the measured values of the contact angle, and are added to obtain the surface free energy. The surface free energy for the other surface (i.e., surface opposite to the surface attached to the semiconductor wafer) of the protective layer 10*a* can be determined in the same manner as above.

The protective layer 10*a* has a thickness of preferably 2 μm or more and 70 μm or less, more preferably 3 μm or more and 50 μm or less, further preferably 5 μm or more and 40 μm or less. The thickness of the protective layer 10*a* can be, for example, obtained by measuring the thickness thereof at any 5 positions selected at random using a dial gauge (model R-205 manufactured by PEACOCK), followed by arithmetically averaging these thickness values.

As will be described later, the protective sheet 10 is subjected to dicing processing such as stealth dicing in the state where the first release liner 10*b* is removed from the protective layer 10*a* to have the one surface of the protective layer 10*a* exposed, and then the exposed surface of the protective layer 10*a* is attached to at least one circuit forming surface of the semiconductor wafer having the plurality of electrode parts on both surfaces and having at least one surface being the circuit forming surface on which the circuit is formed, and further the second release liner 10*c* is removed from the protective layer 10*a*, that is, in the state where only the protective layer 10*a* is attached to the one surface of the semiconductor wafer. Thus, the protective layer 10*a* is preferably configured to be capable of being cut by dicing processing such as stealth dicing. The dicing processing can be performed by blade dicing or laser dicing, or can be performed by the DBG (Dicing Before Grinding) method. The laser dicing is preferably performed by laser abrasion. When the protective layer 10*a* includes the polyethylene oxide, the semiconductor wafer to which the protective layer 10*a* is attached does not necessarily have excellent cutting performance, in which case the dicing processing is preferably performed by a method other than stealth dicing. As will be described later, the protective layer 10*a* of the protective sheet 10 after the dicing processing is subjected to expanding processing at a low temperature (−20° C. to 5° C.); thus, the protective layer 10*a* preferably has an elongation at break at −15° C. of 100% or less. The protective layer 10*a* having the elongation at break at −15° C. of 100% or less can easily be cut into individual pieces each having such a size as to correspond to the size of an individual semiconductor chip obtained by cutting, when the protective layer 10*a* is subjected to expanding processing at a low temperature.

Examples of the first release liner 10*b* include a substrate sheet made of a resin such as polyethylene terephthalate (PET) and subjected to release treatment. Examples of the release treatment include silicone release treatment. Examples of such a release liner include a product named as MRA50 manufactured by Mitsubishi Chemical Corporation. The same product as the first release liner 10*b* can be used also as the second release liner 10*c*.

The thickness of each of the first release liner 10*b* and the second release liner 10*c* is preferably 15 μm or more and 75 μm or less, more preferably 20 μm or more and 60 μm or less. The thickness of the first release liner 10*b* and the thickness of the second release liner 10*c* can be the same as or different from each other. The thickness of each of the first release liner 10*b* and the second release liner 10*c* can be obtained in the same manner as in the thickness of the protective layer 10*a*.

Second Embodiment

In the protective sheet 10 according to the second embodiment, the protective layer 10*a* is made of a curable resin composition with its adhesiveness reducible by curing reaction. In the protective sheet 10 according to the second embodiment, the curable resin composition with its adhesiveness reducible by curing reaction preferably includes a curable resin such as an acrylic resin, a polyurethane resin, an epoxy resin, or a silicone resin. These curable resins can be used individually, or a plurality of these resins can be used in combination. As the curable resin, an acrylic resin is preferably used. In the protective sheet 10 according to the this embodiment, the protective layer 10*a* is formed by, for example, applying a curable resin composition including excess liquid and having its adhesiveness reducible by curing reaction (hereinafter referred to as second protective layer forming composition) to the release liner and allowing it to dry.

When the curable resin is an acrylic resin, the protective layer 10*a* includes preferably 40 mass % or more, more preferably 60 mass % or more, further preferably 80 mass % or more, of the acrylic resin. The protective layer 10*a* includes preferably 98 mass % or less, more preferably 95 mass % or less, of the acrylic resin.

The acrylic resin preferably has a mass average molecular weight Mw of 50 thousand or more and 2 million or less. The acrylic resin having the mass average molecular weight Mw within the above numerical range enables the protective layer 10*a* to be more sufficiently brought into close contact with the one surface of the semiconductor wafer, and, as described above, enables the protective layer 10*a* to be more sufficiently cut when the semiconductor wafer with only the protective layer 10*a* attached to its one surface is subjected to dicing processing such as stealth dicing. The configuration can further suppress film-forming performance from decreasing and suppress cohesive failure from occurring when the second protective layer forming composition including the acrylic resin is applied to the release liner to form the protective layer 10*a*. The configuration that cohesive failure can be suppressed from occurring can suppress the protective layer 10*a* from being brittle and suppress adhesive residue on the one surface of the semiconductor wafer. The mass average molecular weight Mw of the acrylic resin means a value measured by the following method.

<Measurement of Mass Average Molecular Weight Mw of Acrylic Resin>

The mass average molecular weight Mw of the acrylic resin is measured by gel permeation chromatography (GPC). The measurement conditions are as follows. The mass average molecular weight Mw is calculated in terms of polystyrene.

Measuring device: Product name HLC-8120GPC (manufactured by Tosoh Corporation)

Columns: Two columns of TSKgel GMH-H(S) (manufactured by Tosoh Corporation) are connected in series Flow rate: 0.5 mL/min Eluent: Tetrahydrofuran (THF)

Injected sample concentration: 0.1 mass %

Detector: Differential refractometer

As the acrylic resin, a preferable resin includes an acrylic polymer as the base polymer as the main component, and a polymerizable monomer component or a polymerizable oligomer component that is polymerized by an active energy ray and that has a functional group with, for example, a carbon-carbon double bond. Such an acrylic resin has a relatively high viscosity (i.e., is in a highly viscose state) before being irradiated with an active energy ray, and thus enables the protective layer 10*a* to sufficiently adhere to the semiconductor chip in the case where the protective layer 10*a* includes the acrylic resin. In contrast, such an acrylic resin has a reduced viscosity (i.e., is in a poorly viscose state) after being irradiated with an active energy ray for curing, and enables the protective layer 10*a* to be relatively easily removed from the semiconductor chip. Examples of the active energy ray include an electron beam, an ultraviolet ray, an α-ray, a β-ray, a γ-ray, and an X-ray.

Examples of the acrylic polymer include a polymer including a monomer unit derived from a (meth)acrylate. Examples of the (meth)acrylate include alkyl (meth)acrylate, cycloalkyl (meth)acrylate, and aryl (meth)acrylate. As the acrylic polymer, for example, 2-hydroxylethyl acrylate (HEA), ethyl acrylate (EA), butyl acrylate (BA), 2-ethylhexyl acrylate (2EHA), isononyl acrylate (INA), lauryl acrylate (LA), 4-acryloylmorpholine (AMCO), or 2-isocyanatoethyl-methacrylate (MOI) is preferably used as a constituent unit. Only one kind of these acrylic polymers including the aforementioned monomer unit derived from the (meth)acrylate can be used, or two or more kinds of these acrylic polymers including the aforementioned monomer unit derived from the (meth)acrylate can be used in combination.

Examples of the polymerizable monomer component include urethane (meth)acrylate, trimethylolpropane tri (meth)acrylate, pentaerythritol tri(meth)acrylate, pentaerythritol tetra(meth)acrylate, dipentaerythritol monohydroxypenta(meth)acrylate, dipentaerythritol hexa(meth)

acrylate, and 1,4-butanediol di(meth)acrylate. Examples of the polymerizable oligomer component include various oligomers such as urethane-based, polyether-based, polyester-based, polycarbonate-based, and poly butadiene-based oligomers. The content ratio of the polymerizable monomer component or the polymerizable oligomer component in the second protective layer forming composition is selected within the range capable of appropriately reducing the viscosity of the protective layer 10*a*.

The protective layer 10*a* can include an external crosslinking agent. As the external crosslinking agent, any material can be used as long as it can react with a base polymer (e.g., acrylic polymer) to form a crosslinked structure. Examples of the external crosslinking agent include a polyisocyanate compound, an epoxy compound, a polyol compound, an aziridine compound, and a melamine-based crosslinking agent.

When the protective layer 10*a* includes the external crosslinking agent, the protective layer 10*a* includes preferably 0.1 mass parts or more and 10 mass parts or less, more preferably 0.5 mass parts or more and 8 mass parts or less, of the external crosslinking agent based on 100 mass parts of the acrylic resin.

The protective layer 10*a* preferably includes a photopolymerization initiator. Examples of the photopolymerization initiator include an α-ketol-based compound, an acetophenone-based compound, a benzoin ether-based compound, a ketal-based compound, an aromatic sulfonyl chloride-based compound, a photoactive oxime-based compound, a benzophenone-based compound, a thioxanthone-based compound, camphorquinone, a halogenated ketone, an acylphosphinoxide, and an acylphosphonate.

Examples of the α-ketol-based compound include 4-(2-hydroxyethoxy)phenyl(2-hydroxy-2-propyl) ketone, α-hydroxy-α,α'-dimethylacetophenone, 2-methyl-2-hydroxypropiophenone, and 1-hydroxycyclohexylphenyl ketone. Examples of the acetophenone-based compound include methoxyacetophenone, 2,2-dimethoxy-1,2-diphenylethane-1-one, 2,2-diethoxyacetophenone, 2-methyl-1-[4-(methylthio)-phenyl]-2-morpholinopropane-1, and 2-hydroxy-1-(4-(4-(2-hydroxy-2-methylpropionyl)benzoyl)phenyl)-2-methylpropane-1-one. Examples of the benzoin ether-based compound include benzoin ethyl ether, benzoin isopropyl ether, and anisoin methyl ether. Examples of the ketal compound include a benzyl dimethylketal compound. Examples of the aromatic sulfonyl chloride-based compound include 2-naphthalenesulfonyl chloride. Examples of the photoactive oxime-based compound include 1-phenyl-1,2-propanedione-2-(o-ethoxycarbonyl) oxime. Examples of the benzophenone-based compound include benzophenone, benzoin benzoic acid, and 3,3'-dimethyl-4-methoxybenzophenone. Examples of the thioxanthone-based compound include thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone. Among these, 2-hydroxy-1-(4-(4-(2-hydroxy-2methylpropionyl)benzoyl)phenyl)-2-methylpropanone-1-one (i.e., Omnirad 127 manufactured by IGM Resins B.V. as a commercially available product) is preferably used.

The protective layer 10*a* includes preferably 0.1 mass parts or more and 10 mass parts or less, more preferably 0.5 mass parts or more and 7 mass parts or less, further preferably 0.75 mass parts or more and 5 mass parts or less, of the photopolymerization initiator based on 100 mass parts of the acrylic resin.

The protective layer 10*a* can include other components than those above. Examples of the other components include a plasticizer, a filler, an anti-aging agent, an antioxidant, an ultraviolet absorber, a light stabilizer, a heat-resistant stabilizer, an antistatic agent, a surfactant, and a light peel agent.

Examples of the polyurethane resin include a polyurethane resin curable by an active energy ray (e.g., ultraviolet ray). Examples of such a polyurethane resin include a resin having a urethane polymer as a main chain and having an unsaturated group such as a methacryloyl group introduced into a side chain. Specific examples of such a polyurethane resin include trade names: 8UH-1094, 8UH-4005A, 8UH-4025A manufactured by Taisei Fine Chemical Co., Ltd. When the polyurethane resin is used, it is preferable that the protective layer 10*a* include the polyurethane resin at substantially the same ratio as the content ratio of the acrylic resin as described above.

Examples of the epoxy resin include epoxy resins of bisphenol A type, bisphenol F type, bisphenol S type, brominated bisphenol A type, hydrogenated bisphenol A type, bisphenol AF type, biphenyl type, naphthalene type, fluorene type, phenol novolac type, orthocresol novolac type, tris hydroxyphenylmethane type, tetraphenylolethane type, hydantoin type, tris glycidyl isocyanurate type, and glycidyl amine type. Since the epoxy resin is used by being thermally cured, it is preferable that the second protective layer forming composition and the protective layer 10*a* when including the epoxy resin further include a curing agent for the epoxy resin. The curing agent for the epoxy resin preferably includes a phenol resin. Examples of the phenol resin include a novolac type phenol resin, a resol type phenol resin, and a polyoxystyrene such as polyparaoxystyrene. When the epoxy resin is used, it is preferable that the protective layer 10*a* include 5 mass % or more and 70 mass % or less of the epoxy resin, and include 10 mass % or more and 80 mass % or less of the phenol resin.

Examples of the silicone resin include an addition type silicone resin and a condensation type silicone resin. The silicone resin is generally used by being thermally cured. Examples of the addition type silicone resin include a resin obtained by curing an alkenyl group-containing polydialkylcyclohexane and polydialkylhydrogenpolysiloxane by addition reaction using a platinum-based compound as a catalyst. Examples of the condensation type silicone resin include a resin obtained by reacting a methylol group-containing polydialkylsiloxane with a polydialkylhydrogenpolysiloxane using a tin-based catalyst. Examples of the addition type silicone resin include "KS-776A" and "KS-839L" manufactured by Shin-Etsu Chemical Co., Ltd., and examples of the condensation type silicone resin include "KS-723A" and "KS-723B" manufactured by Shin-Etsu Chemical Co., Ltd. When the silicone resin is used, it is preferable that the protective layer 10*a* include the silicone resin at substantially the same ratio as the content ratio of the acrylic resin as described above.

In the protective sheet 10 according to the second embodiment, the protective layer 10*a* has a close contact force to the bare wafer before curing of preferably 0.1 N/100 mm or more and 50 N/100 mm or less, more preferably 0.5 N/100 mm or more and 40 N/100 mm or less, further preferably 1 N/100 mm or more and 30 N/100 mm or less. In addition, the protective layer 10*a* has a close contact force to the bare wafer after curing of preferably 0.01 N/100 mm or more and 10 N/100 mm or less, more preferably 0.03 N/100 mm or more and 6 N/100 mm or less, further preferably 0.05 N/100 mm or more and 3 N/100 mm or less. The close contact force of the protective layer 10*a* to the bare wafer before curing can be measured in the same manner as that described in the first embodiment. The close contact force of the protective layer 10*a* to the bare wafer after curing can be measured in the same manner as that described in the first embodiment, except that the measurement is made after the protective layer 10*a* is cured. When an ultraviolet ray (UV) is used as an active energy ray, the protective layer 10*a* is cured by being irradiated with the ultraviolet ray to the cumulative dose of 200 mJ/cm$^2$ to 500 mJ/cm$^2$. For the heat curing, the protective layer 10*a* is cured by being heated at a temperature at which a curable resin is cured (e.g., 170° C. for the epoxy resin) for a certain period of time (e.g., 1 hour for the epoxy resin).

In the protective sheet 10 according to the second embodiment, the protective layer 10*a* also has a breaking strength at −15° C. of preferably 200 MPa or less, more preferably 100 MPa or less, further preferably 50 MPa or less. In the protective sheet 10 according to the second embodiment, the protective layer 10*a* also has a breaking strength at −15° C. of preferably 0.01 MPa or more, more preferably 0.05 MPa or more, further preferably 0.1 MPa or more. Further, in the protective sheet 10 according to the second embodiment, the protective layer 10*a* also has an elongation at break at −15° C. of preferably 100% or less, more preferably 80% or less, further preferably 50% or less. In the protective sheet 10 according to the second embodiment, the protective layer 10*a* also has an elongation at break at −15° C. of preferably 0.1% or more, more preferably 0.3% or more, further preferably 0.5% or more. In the protective sheet 10 according to the second embodiment, it is preferable that the breaking strength at −15° C. and the elongation at break at −15° C. be within the above respective numerical ranges, both before and after the curing. The breaking strength at −15° C. and the elongation at break at −15° C. can be measured in the same manner as that described in the first embodiment.

In the protective sheet 10 according to the second embodiment, the protective layer 10*a* after the curing has a tensile storage elastic modulus at −15° C. of preferably 1 MPa or more and 30 GPa or less, more preferably 10 MPa or more and 20 GPa or less, further preferably 100 MPa or more and 15 GPa or less. In the protective sheet 10 according to the second embodiment, the protective layer 10*a* after the curing has a tensile storage elastic modulus at 25° C. of preferably 1 MPa or more and 20 GPa or less, more preferably 5 MPa or more and 15 GPa or less, further preferably 10 MPa or more and 10 GPa or less. The tensile storage elastic modulus at −15° C. of the protective layer 10*a* after the curing and the tensile storage elastic modulus at 25° C. of the protective layer 10*a* after the curing can be measured in the same manner as that described in the first embodiment, except that the measurement is made after the protective layer 10*a* is cured. The protective layer 10*a* can be cured in the same manner as that above. Further, in the protective sheet 10 according to the second embodiment, the protective layer 10*a* before the curing has a tensile storage elastic modulus at 25° C. of preferably 10 GPa or less, more preferably 1 GPa or less. The tensile storage elastic modulus at 25° C. of the protective layer 10*a* before the curing can be measured in the same manner as that described in the first embodiment.

In the protective sheet 10 according to the second embodiment, it is also preferable that the protective layer 10*a* have the same thickness as the thickness of the protective layer 10*a* of the protective sheet 10 according to the first embodiment. Further, in the protective sheet 10 of the second embodiment, the same first release liner 10*b* and the same second release liner 10*c* as those described for the protective sheet 10 of the first embodiment can be used.

[Attachment Configuration of Protective Sheet to Protected Surface]

Figure 4A:
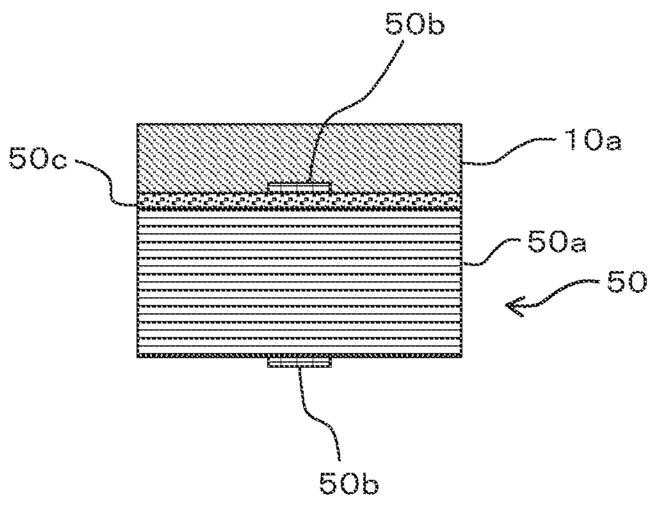
FIG. 4A is a cross-sectional view schematically showing an example configuration in which the protective sheet according to this embodiment is attached to a surface of a semiconductor chip.
Figure 4B:
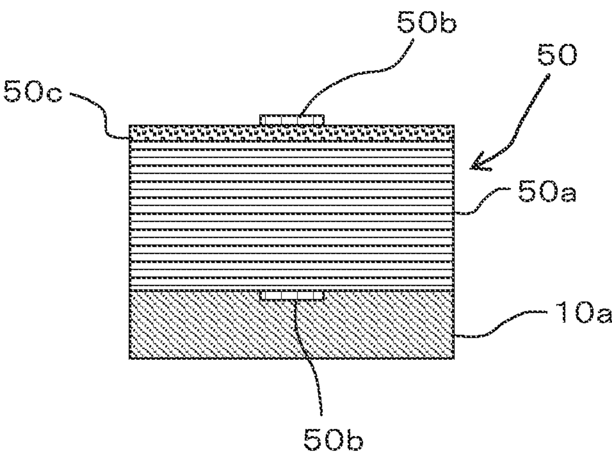
FIG. 4B is a cross-sectional view schematically showing another example configuration in which the protective sheet according to this embodiment is attached to the surface of the semiconductor chip.
Figure 4C:
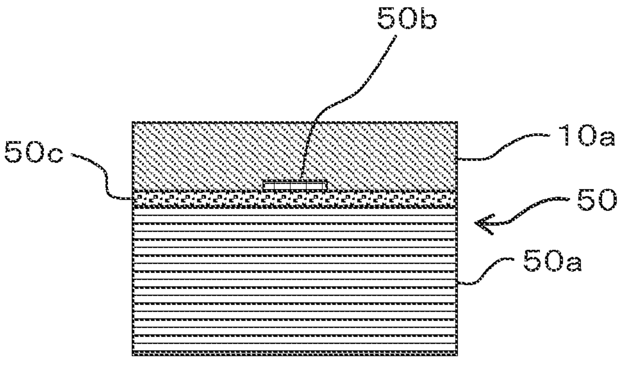
FIG. 4C is a cross-sectional view schematically showing still another example configuration in which the protective sheet according to this embodiment is attached to the surface of the semiconductor chip.
Figure 4D:
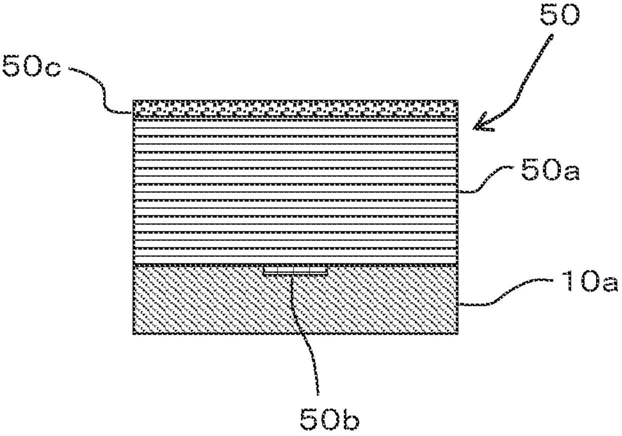
FIG. 4D is a cross-sectional view schematically showing yet another example configuration in which the protective sheet according to this embodiment is attached to the surface of the semiconductor chip.
Figure 4E:
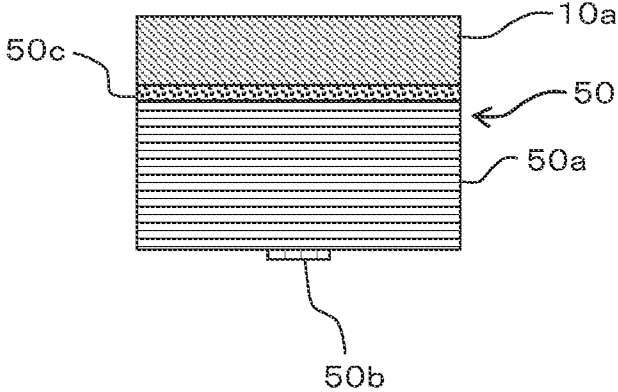
FIG. 4E is a cross-sectional view schematically showing still another example configuration in which the protective sheet according to this embodiment is attached to the surface of the semiconductor chip.

Hereinafter, a description will be given on an attachment configuration of the protective sheet 10 according to this embodiment to the protected surface by taking, for example, the case where the electronic component having the protected surface is a semiconductor chip, with reference to FIG. 4A to FIG. 4E. FIG. 4A and FIG. 4B each show a semiconductor chip 50 including a semiconductor chip body 50*a* and a pair of two electrode parts 50*b* respectively disposed on both sides of the semiconductor chip body 50*a*. In each of FIG. 4A and FIG. 4B, one surface of the semiconductor chips body 50*a* serves as a circuit forming surface on which a circuit is formed. In each of FIGS. 4A and 4B, an area of the circuit forming surface in which the circuit is formed is shown as a circuit forming area 50*c*. FIGS. 4C to 4E each show the semiconductor chip 50 including the semiconductor chip body 50*a* and one electrode part 50*b* on one surface of the semiconductor chip body 50*a*. In FIG. 4C, one electrode part 50*b* is disposed on the circuit forming surface (i.e., surface included in the circuit forming area 50*c*) while in FIGS. 4D and 4E, one electrode part 50*b* is disposed on an opposite surface to the circuit forming surface.

As shown in FIG. 4A, the protective layer 10*a* of the protective sheet 10 according to this embodiment can be attached to the semiconductor chip 50 including the pair of two electrode parts 50*b* respectively disposed on both surfaces of the semiconductor chip body 50*a*, so as to protect the circuit forming surface formed on one surface of the semiconductor chip 50. That is, in the example shown in FIG. 4A, the circuit forming surface having the electrode part 50*b* disposed thereon is the protected surface. The protective layer 10*a* of the protective sheet 10 according to this embodiment thus attached can protect the circuit forming surface and the electrode part 50*b* disposed on the circuit forming surface. Such attachment configuration is particularly useful when a semiconductor wafer that includes a semiconductor wafer body and a plurality of electrode parts paired on both surfaces of the semiconductor wafer body and that has the semiconductor wafer body with its both surfaces being circuit forming surfaces is placed on the stage of the dicing apparatus to bring the opposite surface to the circuit forming surface into abutting contact with the stage to separate the semiconductor wafer placed on the stage into a plurality of individual semiconductor chips. Specifically, when the cutting of the semiconductor wafer into the plurality of individual semiconductor chips causes portions of the semiconductor wafer near cut parts to be pulverized into minute foreign matters, such attachment configuration can suppress a large number of the minute foreign matters from adhering to and remaining on the circuit forming surface.

As shown in FIG. 4B, the protective layer 10*a* of the protective sheet 10 according to this embodiment can be attached to the semiconductor chip 50 including the pair of two electrode parts 50*b* respectively disposed on both surfaces of the semiconductor chip body 50*a*, so as to protect the opposite surface to the circuit forming surface formed on one surface of the semiconductor chip 50. That is, in the example shown in FIG. 4B, the surface including the electrode part 50*b* and opposite to the circuit forming surface is the protected surface. The protective layer 10*a* of the protective sheet 10 according to this embodiment thus attached can protect the opposite surface to the circuit forming surface and the electrode part 50*b* disposed on the opposite surface. Such attachment configuration is particularly useful when the semiconductor wafer that includes the semiconductor wafer body and the plurality of electrode parts paired on both surfaces of the semiconductor wafer body and that has the semiconductor wafer body with its both surfaces being circuit forming surfaces is placed on the stage of the dicing apparatus to bring the circuit forming surface into abutting contact with the stage to separate the semiconductor wafer placed on the stage into a plurality of individual semiconductor chips. Specifically, when the cutting of the semiconductor wafer into the plurality of individual semiconductor chips results in the minute foreign matters as described above, such attachment configuration can suppress a large number of the minute foreign matters from adhering to and remaining on the opposite surface to the circuit forming surface.

Further, as shown in FIG. 4C, the protective layer 10*a* of the protective sheet 10 according to this embodiment can be attached to the semiconductor chip 50 including the semiconductor chip body 50*a* with its one surface being a circuit forming surface and including one electrode part 50*b* only on the circuit forming surface, so as to protect the circuit forming surface. That is, also in the example shown in FIG. 4C, the circuit forming surface having the electrode part 50*b* disposed thereon is the protected surface. The protective layer 10*a* of the protective sheet 10 according to this embodiment thus attached can protect the circuit forming surface and the electrode part 50*b* disposed on the circuit forming surface. Such attachment configuration is particularly useful when the semiconductor wafer that includes the semiconductor wafer body with its one surface being a circuit forming surface and the plurality of electrode parts only on the circuit forming surface is placed on the stage of the dicing apparatus to bring the opposite surface to the circuit forming surface into abutting contact with the stage to separate the semiconductor wafer placed on the stage into a plurality of individual semiconductor chips. Specifically, when the cutting of the semiconductor wafer into the plurality of individual semiconductor chips results in the minute foreign matters as described above, such attachment configuration can suppress a large number of the minute foreign matters from adhering to and remaining on the circuit forming surface.

As shown in FIG. 4D, the protective layer 10*a* of the protective sheet 10 according to this embodiment can be attached to the semiconductor chip 50 including the semiconductor chip body 50*a* with its one surface being a circuit forming surface and including one electrode part 50*b* only on the opposite surface to the circuit forming surface, so as to protect the opposite surface to the circuit forming surface. That is, also in the example shown in FIG. 4D, the surface including the electrode part 50*b* and opposite to the circuit forming surface is the protected surface. The protective layer 10*a* of the protective sheet 10 according to this embodiment thus attached can protect the opposite surface to the circuit forming surface and the electrode part 50*a* disposed on the opposite surface. Such attachment configuration is particularly useful when the semiconductor wafer that includes the semiconductor wafer body with its one surface being a circuit forming surface and a plurality of electrode parts only on the opposite surface to the circuit forming surface is placed on the stage of the dicing apparatus to bring the circuit forming surface into abutting contact with the stage to separate the semiconductor wafer placed on the stage into a plurality of individual semiconductor chips. Specifically, when the cutting of the semiconductor wafer into the plurality of individual semiconductor chips results in the minute foreign matters as described above, such attachment configuration can suppress a large number of the minute foreign matters from adhering to and remaining on the opposite surface to the circuit forming surface.

Further, as shown in FIG. 4E, the protective layer 10*a* of the protective sheet 10 according to this embodiment can be attached to the semiconductor chip 50 including the semiconductor chip body 50*a* with its one surface being a circuit forming surface and including one electrode part 50*b* only on the opposite surface to the circuit forming surface, so as to protect the circuit forming surface. That is, in the example shown in FIG. 4E, the circuit forming surface having no electrode part 50*b* disposed thereon is the protected surface. The protective layer 10*a* of the protective sheet 10 according to this embodiment thus attached can protect the circuit forming surface. Such attachment configuration is particularly useful when the semiconductor wafer that includes the semiconductor wafer body with its one surface being a circuit forming surface and the plurality of electrode parts only on the opposite surface to the circuit forming surface is placed on the stage of the dicing apparatus to bring the opposite surface to the circuit forming surface into abutting contact with the stage to bring the semiconductor wafer placed on the stage into a plurality of individual semiconductor chips. Specifically, when the cutting of the semiconductor wafer into the plurality of individual semiconductor chips results in the minute foreign matters as described above, such attachment configuration can suppress a large number of the minute foreign matters from adhering to and remaining on the circuit forming surface.

FIGS. 4A to 4E each show the case where the protective layer 10*a* of the protective sheet 10 according to this embodiment is attached to only one surface of the semiconductor chip as an example, but the protective layer 10*a* can be attached to each of both surfaces of the semiconductor chip as necessary.

FIGS. 4A to 4E each show the case where the protected surface is one surface of the semiconductor chip as an example, but the protected surface can be a protected surface of other electronic components. For example, the protected surface can be at least one surface of the semiconductor wafer for obtaining semiconductor chips; can be at least one surface of the pseudo wafer including the support substrate and the package formed by collectively resin-sealing the plurality of the semiconductor chips disposed on the support substrate, that is, the pseudo wafer including the support substrate and the package integrally formed with each other; can be at least one surface of the pseudo wafer formed of the package with the support substrate removed therefrom, that is, the pseudo wafer formed only of the package; can be at least one surface of the divided pseudo wafer product in which the pseudo wafer is divided into constituent units each including at least one semiconductor chip; can be at least one surface of the circuit board; or can be at least one surface of the connected circuit board formed of the plurality of the circuit boards connected to each other. When the pseudo wafer has at least one surface including the rewiring layer, the protective layer 10*a* of the protective sheet 10 according to this embodiment is attached to protect, for example, the rewiring layer formed on the pseudo wafer or the divided pseudo wafer product. Even when the cutting of the pseudo wafer to obtain the divided pseudo wafer products causes portions of the sealing resin near cut parts to be pulverized into minute foreign matters, the protective layer 10*a* of the protective sheet 10 according to this embodiment attached to the pseudo wafer as described above can suppress a large number of the minute foreign matters from adhering to and remaining on, for example, the rewiring layer. For the circuit board and the connected circuit board, the protective layer 10*a* of the protective sheet 10 according to this embodiment is attached to protect, for example, the circuit formed thereon. Even when the cutting of the connected circuit board to obtain the plurality of the circuit boards causes the resin of the support substrate of the connected circuit board to be pulverized into minute foreign matters, the protective layer 10*a* of the protective sheet 10 according to this embodiment attached to the connected circuit board to protect, for example, the circuits as described above can suppress a large number of the minute foreign matters from adhering to and remaining on, for example, the circuits.

The protected surface of another electronic component can be at least one surface of the wafer level package including the circuit board and the plurality of the semiconductor packages mounted on the circuit board, or can be at least one surface of each of the plurality of semiconductor packages obtained by dividing the wafer level package into individual pieces. In the wafer level package, one surface of each semiconductor package can be formed of one surface of the glass piece. When the one surface of each semiconductor package in the wafer level package is formed of the one surface of the glass piece, the protective layer 10*a* of the protective sheet 10 according to this embodiment is attached to protect the one surface of the glass piece forming the one surface of the each of the plurality of semiconductor packages. Even when cutting the circuit board portion of the wafer level package to obtain the semiconductor packages causes portions of the circuit board near cut parts to be pulverized into minute foreign matters, the protective layer 10*a* of the protective sheet 10 according to this embodiment attached to the wafer level package to protect the one surface of the glass plate as described above can suppress a large number of the minute foreign matters from adhering to and remaining on, for example, the one surface of the glass plate.

Further, the protected surface of the other electronic component can be at least one surface of the layered product for image sensor package, the layered product including a sensor wafer body with a plurality of circuits formed on its one surface; and a glass plate having substantially the same dimension as that of the sensor wafer body in plan view and laminated on the one surface (i.e., the surface on which the plurality of circuits are formed) of the sensor wafer body via an adhesive layer composed of an adhesive, glass frit, or the like, and can be at least one surface of each of the image sensor packages obtained by separating the layered product for image sensor package into individual pieces. For the layered product for image sensor package, the protective layer 10*a* of the protective sheet 10 according to this embodiment is, for example, attached to protect the one surface of glass plate. For the image sensor package, the protective layer 10*a* of the protective sheet 10 according to this embodiment is, for example, attached to protect one surface of each of the glass pieces obtained by dividing the glass plate into individual pieces. Even when the cutting of the layered product for image sensor package to obtain the image sensor packages causes portions of the sensor wafer body or the like near cut parts to be pulverized into minute foreign matters, the protective layer 10*a* of the protective sheet 10 according to this embodiment attached to the layered product for image sensor package to protect the one surface of the glass plate as described above can suppress the minute foreign matters from adhering to and remaining on the one surface of the glass piece of each of the image sensor packages.

As described above, the object to be protected by the protective layer 10*a* of the protective sheet 10 according to this embodiment can be one surface of the glass piece forming the display surface of the display apparatus, or can be one surface of the glass plate for obtaining the glass pieces, rather than the protected surface of the electronic components. Even when the cutting of the glass plate into the plurality of glass pieces causes portions of the glass plate near cut parts to be pulverized into minute foreign matters, the protective layer 10*a* of the protective sheet 10 according to this embodiment attached to the one surface of the glass plate for obtaining the glass pieces as described above can suppress the minute foreign matters from adhering to and remaining on the one surface of the glass piece (i.e., display surface of the display apparatus).

[Method for Using Protective Sheet]

The protective sheet 10 according to this embodiment is used as an assisting tool for producing an electronic component device. Hereinafter, a description will be given on a specific example of using the protective sheet 10 according to this embodiment, taking the case where a semiconductor device is produced as the electronic component device. The description hereinafter will be given on an example of obtaining a TSV type semiconductor chip using the protective sheet 10 according to this embodiment.

In producing the semiconductor device according to this embodiment, the protective sheet 10 according to this embodiment is attached for use to protect the electrode part of a semiconductor wafer having such an electrode part. The semiconductor wafer includes a semiconductor wafer body, and a plurality of the electrode parts disposed on both surfaces of the semiconductor wafer body for electrical connection with electrode parts of other members. In the semiconductor wafer, the semiconductor wafer body generally has a disk shape, with an outer diameter of 12 inches (300 mm) and a thickness of 40 μm to 50 μm. Further, in the semiconductor wafer, at least one surface of the semiconductor wafer body is a circuit forming surface on which a circuit is formed. More specifically, in the semiconductor wafer, portions of the semiconductor wafer body corresponding to the semiconductor chips when being cut into individual pieces each include at least a pair of electrode parts electrically connected to the other members on both surfaces of each of the portions. Further, in the semiconductor wafer, the portions of the semiconductor wafer body corresponding to the semiconductor chips when being cut into individual pieces each have at least one surface on which the circuit for each corresponding one of the semiconductor chips is formed.

Figure 5:
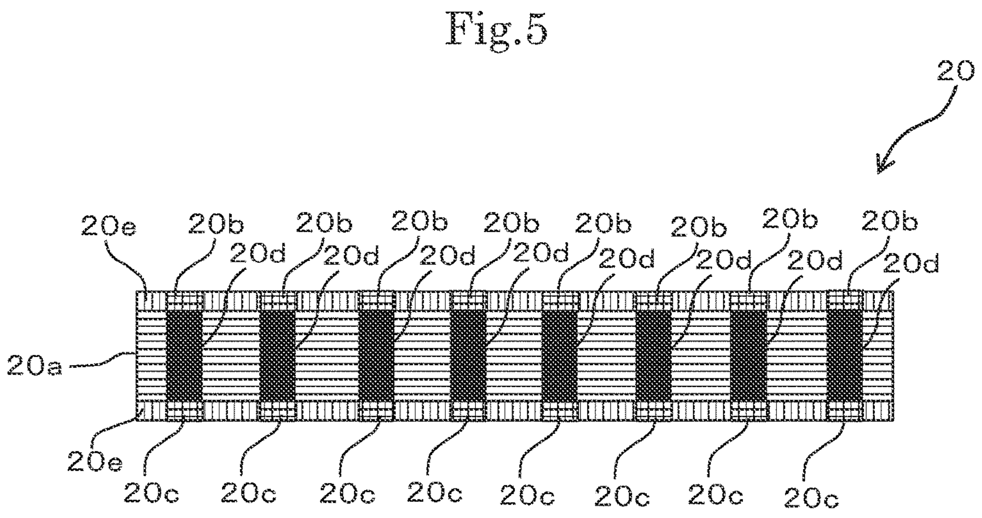
FIG. 5 is a schematic cross-sectional view showing an example of a semiconductor wafer including electrode parts on its both surfaces.

Examples of such a semiconductor wafer include the wafer shown in FIG. 5. A semiconductor wafer 20 shown in FIG. 5 is a TSV (Through Silicon Via) type wafer including a semiconductor wafer body 20*a*, a pair of electrode parts 20*b* and 20*c* disposed respectively on both surfaces of the semiconductor wafer body 20*a* for electrical connection to other members, and a conductive part 20*d* passing through the semiconductor wafer body 20*a* in its thickness direction to allow the pair of electrode parts 20*b* and 20*c* to be electrically conducted to each other. In the semiconductor wafer 20 shown in FIG. 5, only one surface (only the surface on which the electrode part 20*b* is disposed) serves as the circuit forming surface.

In the semiconductor wafer 20 shown in FIG. 5, the conductive part 20*d* is formed of a solid conductor. However, the conductive part 20*d* can be configured to be brought into contact with at least part of the pair of electrode parts 20*b* and 20*c* for electrical connection between the pair of electrode parts 20*b* and 20*c*, and can be, for example, formed of a hollow conductor. In the semiconductor wafer 20 shown in FIG. 5, an insulating layer 20*e* is formed on each of both surfaces of the semiconductor wafer body 20*a* to suppress conduction between each adjacent electrode parts, specifically, between each adjacent electrode parts 20*b* or between each adjacent electrode parts 20*c*. In the semiconductor wafer 20 shown in FIG. 5, an outermost surface of one insulating layer 20*e* is flush with an outermost surface of each electrode part 20*b*, and an outermost surface of the other insulating layer 20*e* is flush with an outermost surface of each electrode part 20*c*. That is, in the semiconductor wafer 20 shown in FIG. 5, each electrode part 20*b* is disposed on the semiconductor wafer body 20*a* to have only its outermost surface exposed from the one insulating layer 20*e*, and each electrode part 20*c* is disposed on the semiconductor wafer body 20*a* to have only its outermost surface exposed from the other the insulating layer 20*e*. The configuration can also be such that each electrode part 20*b* is disposed on the semiconductor wafer body 20*a* to be entirely covered with the one insulating layer 20*e*, and each electrode part 20*c* is disposed on the semiconductor wafer body 20*a* to be entirely covered with the other insulating layer 20*e*. That is, the configuration can be such that each electrode part 20*b* is disposed on the semiconductor wafer body 20*a* to be embedded in the one insulating layer 20*e* and each electrode part 20*c* is disposed on the semiconductor wafer body 20*a* to be embedded in the other insulating layer 20*e*.

The electrode parts 20*b* and 20*c* and the conductive part 20*d* can be formed integrally, or can be formed separately. The electrode parts 20*b* and 20*c* and the conductive part 20*d* in the state of being formed integrally are inserted into a conductive part through hole formed to pass through the semiconductor wafer body 20*a*. Examples of the material for forming the electrode parts 20*b* and 20*c* and the conductive part 20*d* include copper and aluminum. The electrode parts 20*b* and 20*c* are disposed on the semiconductor wafer body 20*a* to have a thickness of 5 nm to 10 μm from the outermost surface of the semiconductor wafer body 20*a*. The conductive part 20*d* has substantially the same length as the length of the conductive part through hole (i.e., the thickness of the semiconductor wafer body 20*a*). The dimension and the shape of the conductive part 20*d* are appropriately selected according to the shape of the conductive part through hole. For example, when the conductive part through hole has a cylindrical shape, the conductive part 20 having a cylindrical shape and having an outer diameter slightly smaller than the outer diameter of the conductive part through hole is selected.

The insulating layer 20*e* is made of, for example, silicon dioxide ($SiO_2$) or silicon nitride (SiN) as a material. The insulating layer 20*e* can be formed on both surfaces of the semiconductor wafer body 20*a* by, for example, the CVD method. The thickness of the insulating layer 20*e* is selected appropriately according to the thickness of the electrode part 20*b*, 20*c*.

[Method for Producing Electronic Component]

A method for producing an electronic component according to this embodiment includes: a protective sheet attaching step S1 of attaching a protective sheet to a connected electronic component product including a plurality of electronic components that have protected surfaces and are connected to each other with the protected surfaces facing in a same direction, so as to protect the protected surfaces of the plurality of electronic components; a connected electronic component product dividing step S2 of dividing the connected electronic component product with the protective sheet attached into pieces with spaces therebetween in a plane direction to obtain the plurality of electronic components to which divided pieces of the protective sheet are respectively attached; and a protective sheet removing step S3 of removing the divided pieces of the protective sheet respectively from the plurality of electronic components. In the method for producing the electronic component according to this embodiment, the protective sheet includes a protective layer for being attached to the protected surfaces. In the method for producing the electronic component according to this embodiment, the protective layer is made of one of a water-soluble resin composition and a curable resin composition with its adhesiveness reducible by curing reaction.

[Method for Producing Semiconductor Device]

Next, a description will be given on a method for producing a semiconductor device using a semiconductor wafer having electrode parts on both surfaces and the protective sheet 10 according to this embodiment, as an example of the method for producing the electronic component. In the method for producing the semiconductor device, the "semiconductor wafer" corresponds to the "connected electronic component product" in the abovementioned method for producing the electronic component, and the "semiconductor chip" corresponds to the "electronic component" in the abovementioned method for producing the electronic components. Further, in the method for producing the semiconductor device, the definition of the phrase "cut into individual pieces" is included in the definition of the term "divided".

A method for producing a semiconductor device includes: a step of attaching the protective sheet 10 to at least one circuit forming surface of a semiconductor wafer including a semiconductor wafer body and electrode parts disposed on both surfaces of the semiconductor wafer body for electrical connection to electrode parts of other members, the semiconductor wafer body having at least one surface being a circuit forming surface on which a circuit is formed (protective sheet attaching step S1*a*): a step of cutting the semiconductor wafer (specifically, the semiconductor wafer body) to which the protective sheet 10 is attached into individual pieces (semiconductor wafer cutting step S2*a*); and a step of removing the protective sheet 10 from the semiconductor wafer (protective sheet removing step S3*a*). Hereinafter, a more specific description will be given on the method for producing the semiconductor device according to this embodiment, taking a 1'st embodiment and a 2'nd embodiment as examples. In each of the 1'st embodiment and the 2'nd embodiment, the method for producing the semiconductor device is performed using the semiconductor wafer 20 shown in FIG. 5 and the protective sheet 10 according to this embodiment.

1'st Embodiment

First, a description will be given on the method for producing the semiconductor device according to the 1'st embodiment with reference to FIGS. 6A to 6H. In the method for producing the semiconductor device according to the 1'st embodiment, the protective sheet 10 according to the first embodiment described above is used as the protective sheet 10. That is, the protective layer 10*a* of the protective sheet 10 includes a water-soluble polymer compound.

<Preparation Step S0a>

Figure 6A:
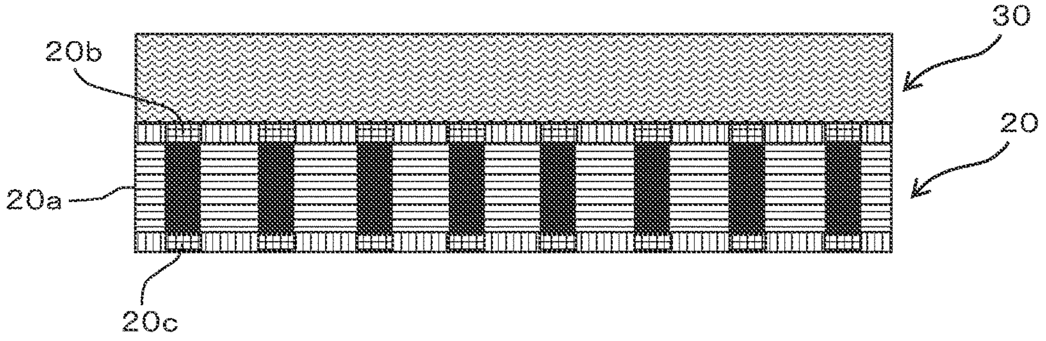
FIG. 6A is a cross-sectional view schematically showing an example state of a preparation step in a method for producing a semiconductor device.
Figure 6B:
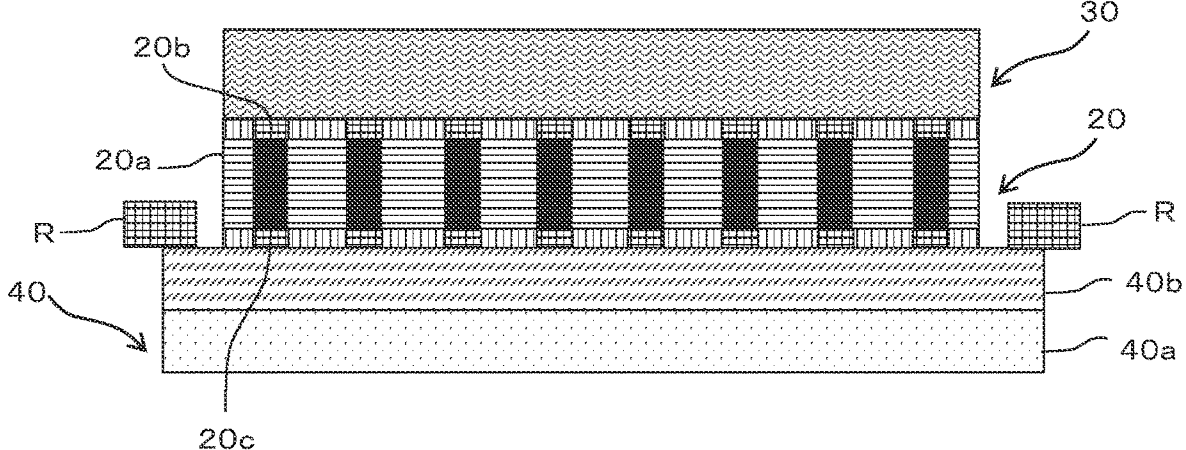
FIG. 6B is a cross-sectional view schematically showing an example state of the preparation step in the method for producing the semiconductor device.
Figure 6C:
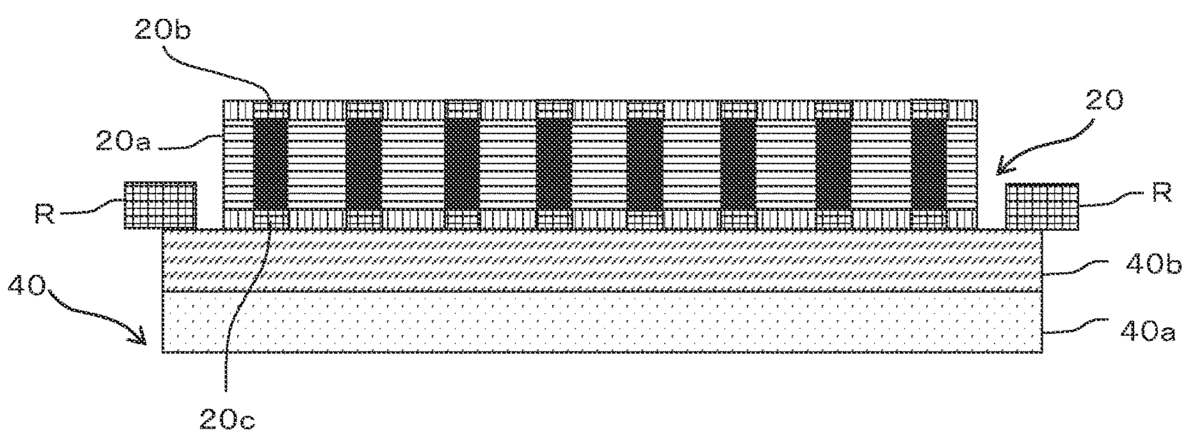
FIG. 6C is a cross-sectional view schematically showing an example state of the preparation step in the method for producing the semiconductor device.

In the method for producing the semiconductor device according to the 1'st embodiment, in a preparation step S0a, a glass carrier 30 as a support is attached, as shown in FIG. 6A, to one surface of the semiconductor wafer including the semiconductor wafer body 20a and the electrode parts 20b and 20c disposed on both surfaces of the semiconductor wafer body 20a for electrical connection to electrode parts of other members, the one surface being a surface of the semiconductor wafer body 20a as a circuit forming surface on which a circuit is formed (i.e., surface on which the electrode part 20b is disposed). As the semiconductor wafer 20, a semiconductor wafer with the semiconductor wafer body 20a having an outer diameter of 12 inches (300 mm) and a thickness of 40 μm to 50 μm is generally used. As the glass carrier 30, a glass carrier having substantially the same plane dimension and the same plane shape as those of the semiconductor wafer 20 and having a thickness of 0.5 mm to 5 mm is generally used. Next, as shown in FIG. 6B, the semiconductor wafer 20 to which the glass carrier 30 is attached is attached to an adhesive layer 40b of a dicing tape 40 formed with the adhesive layer 40b laminated on a base layer 40a. Specifically, after a dicing ring R is attached to the adhesive layer 40b of the dicing tape 40, a surface of the semiconductor wafer 20 on which the glass carrier 30 is attached and the electrode part 20c is disposed (i.e., opposite surface to the surface to which the glass carrier 30 is attached) is attached to the adhesive layer 40b of the dicing tape 40. Since the semiconductor wafer 20 has the semiconductor wafer body 20a as relatively thin as 20 μm to 100 μm, the semiconductor wafer 20 itself does not have a sufficient strength, but the semiconductor wafer 20 attached to the glass carrier 30 can have a more sufficient strength for being attached to the adhesive layer 40b of the dicing tape 40. This configuration can suppress the semiconductor wafer body 20a from being damaged when the semiconductor wafer 20 is attached to the adhesive layer 40b of the dicing tape 40. Next, as shown in FIG. 6C, the glass carrier 30 is removed from the semiconductor wafer 20.

<Protective Sheet Attaching Step S1a>

Figure 6D:
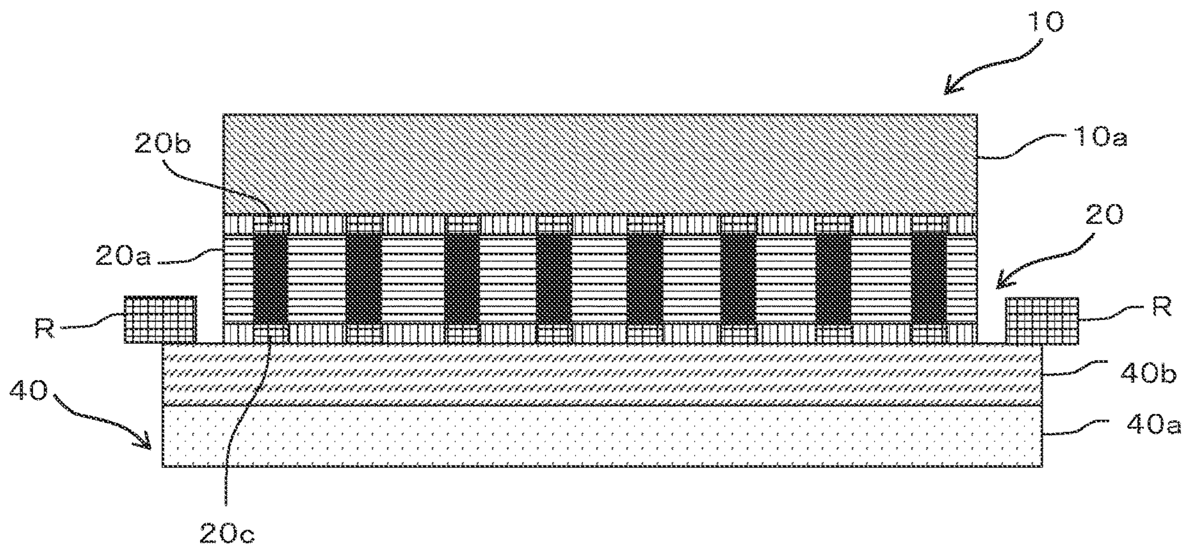
FIG. 6D is a cross-sectional view schematically showing an example state of a protective sheet attaching step in the method for producing the semiconductor device.

In the method for producing the semiconductor device according to the 1'st embodiment, as shown in FIG. 6D, the protective sheet 10 is attached to the semiconductor wafer 20 in the protective sheet attaching step S1a. Specifically, the first release liner 10b is removed from the protective sheet 10 to have one surface of the protective layer 10a exposed and attach the exposed surface to one surface of the semiconductor wafer 20 (i.e., surface on which the electrode part 20b is disposed), followed by removing the second release liner 10c from the protective sheet 10 to attach the protective sheet 10 to the semiconductor wafer 20 in the state where the other surface of the protective layer 10a is exposed. In the example shown in FIG. 6D, the second release liner 10c is removed from the protective sheet 10 to have the other surface of the protective layer 10a exposed, but the second release liner 10c is not necessarily removed in the protective sheet attaching step S1. The configuration can be such that a fragile part forming step to be described later is completed with the second release liner 10c attached, and the second release liner 10c is removed after the fragile part forming step to perform the semiconductor wafer dividing step S2a.

Figure 6E:
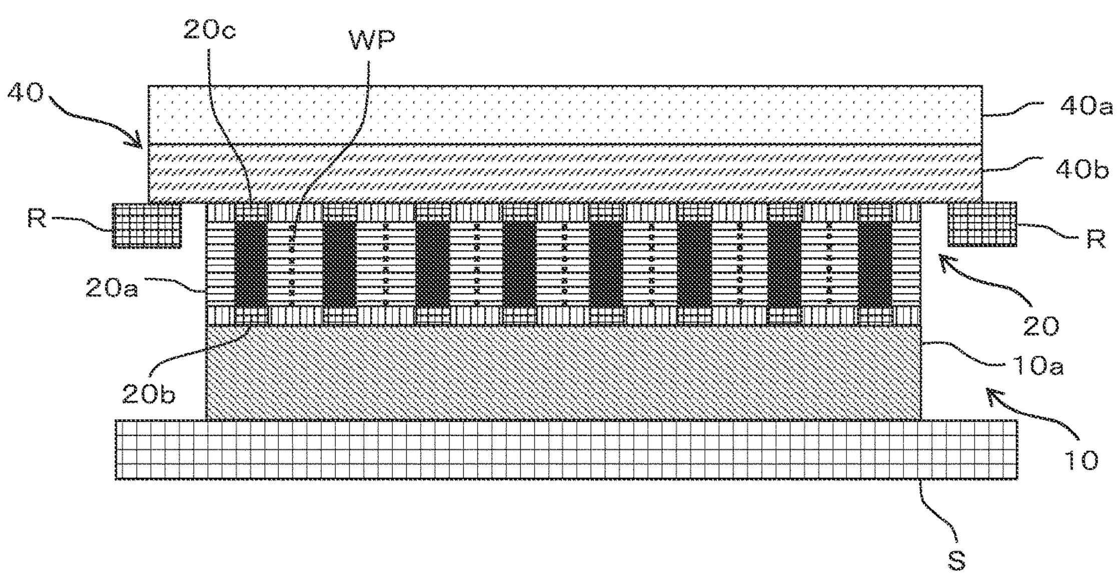
FIG. 6E is a cross-sectional view schematically showing an example state of a fragile part forming step in the method for producing the semiconductor device.

Next, as shown in FIG. 6E, the semiconductor wafer 20 with one surface attached to the protective sheet 10 (specifically, protective layer 10a) and the other surface attached to the adhesive layer 40b of the dicing tape 40 is placed on a stage S of a stealth dicer. Specifically, the semiconductor wafer 20 is placed on the stage S to have the protective sheet 10 in abutting contact with the stage S. Then, the semiconductor wafer 20 is irradiated with a laser beam having its condensing point set at the inside of the semiconductor wafer 20 (i.e., semiconductor wafer body 20a) from the laser irradiation source of the stealth dicer along a predetermined dicing position (cutting line) to form a fragile part WP inside the semiconductor wafer 20 (i.e., semiconductor wafer body 20a) through abrasion by multiphoton absorption (fragile part forming step). The fragile part WP is a modified area for separating the semiconductor wafer 20 into units of individual semiconductor chips. Details of a method for forming the fragile part WP on the cutting line by irradiating the semiconductor 20 with a laser beam are found in, for example, JP 2002-192370 A, but the conditions for laser beam irradiation in this embodiment are adjusted as appropriate within, for example, the following conditions:

<Conditions for Laser Beam Irradiation>

(A) Laser Beam
- Laser source; Semiconductor laser pumped Nd:YAG laser
- Wavelength: 1064 nm, 1088 nm, 1099 nm, or 1342 nm
- Spot cross-sectional area of laser beam: $3.14\times10^{-5}$ cm$^2$
- Oscillation mode; Q-switched pulse
- Repetition frequency: 100 kHz or less
- Pulse width; 1 μs or less
- Power; 1 mJ or less
- Laser beam quality: TEM00
- Polarization characteristics; Linear polarization (B) Condenser Lens
- Magnification: 100 times or less
- NA; 0.55
- Transmittance to laser beam wavelength; 100% or less (C) Stage Moving Speed; 280 mm/sec or Less <Semiconductor Wafer Cutting Step S2a>

Figure 6F:
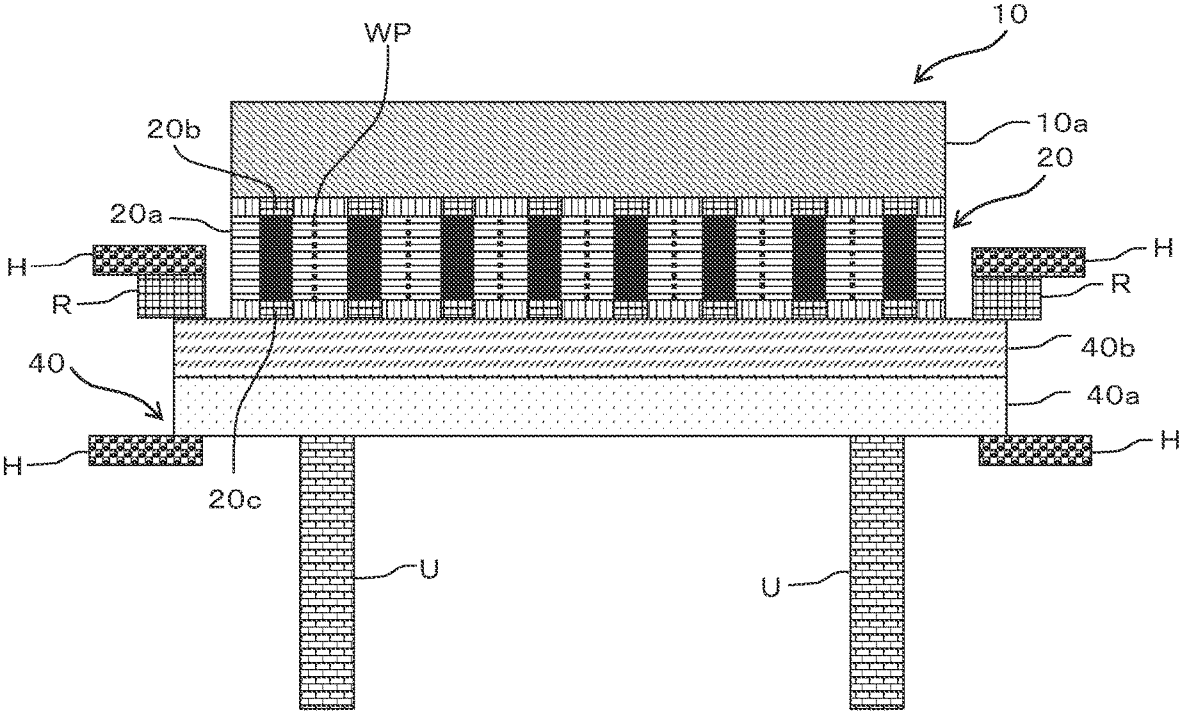
FIG. 6F is a cross-sectional view schematically showing an example state of a semiconductor wafer cutting step in the method for producing the semiconductor device.
Figure 6G:
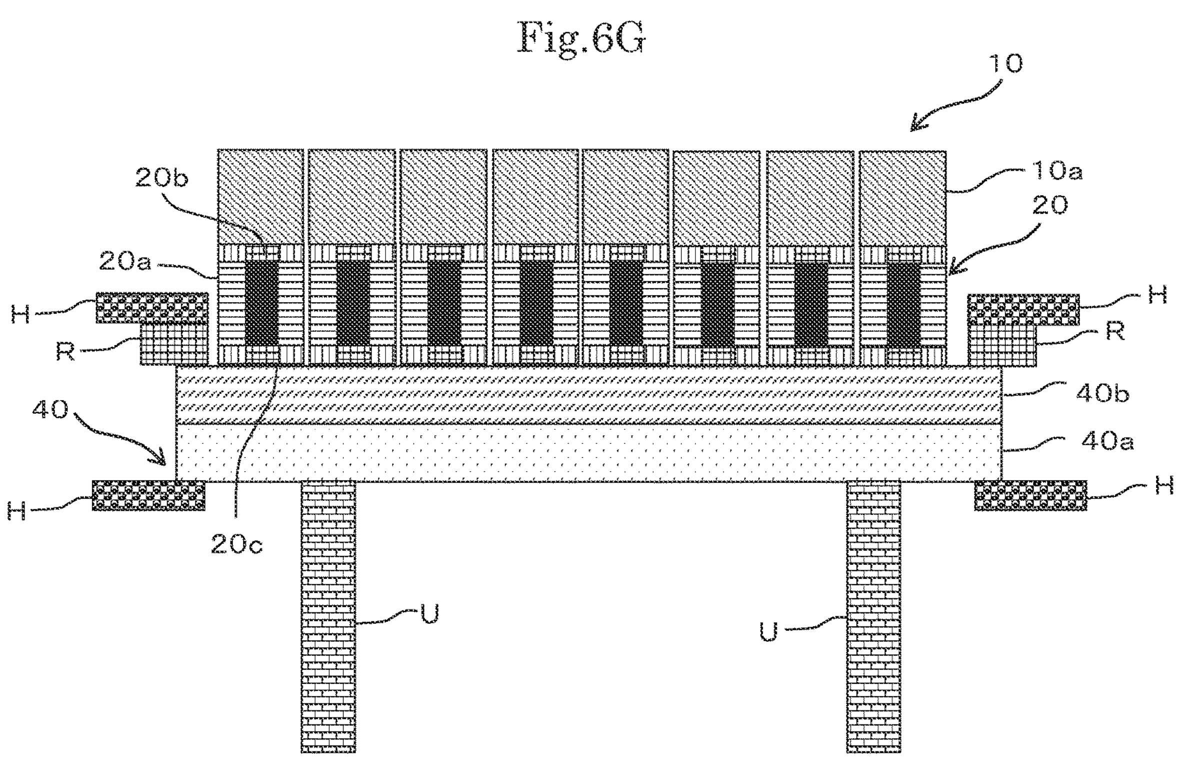
FIG. 6G is a cross-sectional view schematically showing an example state of the semiconductor wafer cutting step in the method for producing the semiconductor device.
Figure 6H:
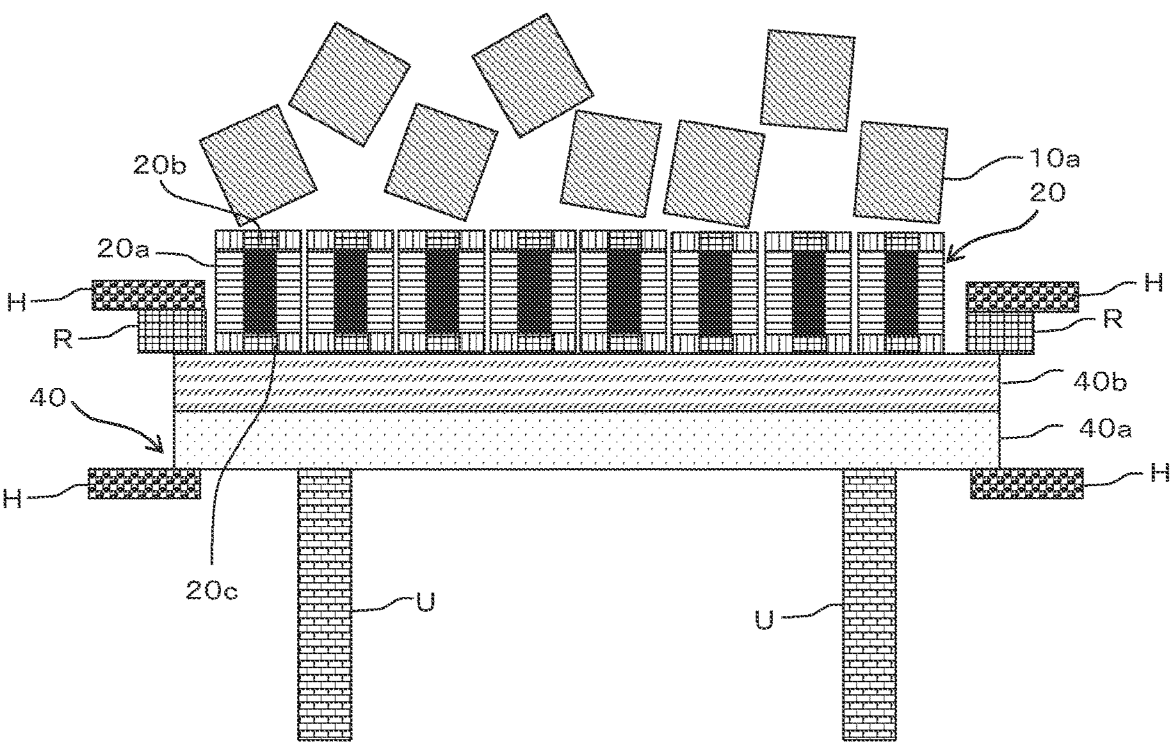
FIG. 6H is a cross-sectional view schematically showing an example state of a protective sheet removing step in the method for producing the semiconductor device.

Next, after the semiconductor wafer 20 is removed from the stage S of the stealth dicer, the dicing ring R is fixed to a holding tool H of the expanding apparatus, and both end edges of the base layer 40a of the dicing tape 40 are fixed to the holding tool H, as shown in FIG. 6F. Then, the dicing tape 40 is pushed up from below using a push-up member U of the expanding apparatus to thereby spread the dicing tape 40 in its plane direction. This allows the semiconductor wafer body 20a having the fragile part WP thereinside to be cut along the fragile part WP into the plurality of individual semiconductor chips under a certain temperature condition. In so doing, the protective layer 10a as well as the semiconductor wafer is cut into individual pieces each having a size corresponding to the size of a chip. The temperature condition is, for example, −30° C. to −5° C., preferably −25° C. to 0° C., more preferably −20° C. to −5° C. Then, the push-up member U is lowered as shown in FIG. 6G to release the expansion state.

<Protective Sheet Removing Step S3a>

In the method for producing the semiconductor device according to the 1'st embodiment, water is applied to the protective layer 10a in the protective sheet removing step S3a using a water washing mechanism of the expanding apparatus. Specifically, water is applied (specifically, injected) to each individual piece of the protective layer 10a from the water washing mechanism of the expanding apparatus to remove the individual piece of the protective layer 10 from the surface of each semiconductor chip to have one surface of the semiconductor chip (i.e., surface not attached to the dicing tape 40) exposed (see FIG. 6H). Examples of the expanding apparatus equipped with the water washing mechanism include a cutting apparatus DDS2300 manufactured by DISCO Corporation. The expanding apparatus includes a rotatable stage, and the water washing mechanism includes a water injecting part for injecting water toward an individual piece of the protective layer 10*a*. Water is injected from the water injecting part toward the individual piece of the protective layer 10*a* while rotating the stage to thereby discharge the protective layer 10*a* dissolved in water out of the stage. In such an apparatus, the rotational speed of the stage is preferably 500 rpm to 4000 rpm, the injection amount of water (i.e., volume of water) is preferably 0.05 L/min to 5.0 L/min, and the period of time for injecting water is preferably 5 seconds to 300 seconds. The protective sheet removing step S3 can also be performed by injecting water at a high pressure. The pressure at which water is injected can be set as appropriate in consideration of, for example, the size of a semiconductor chip as an injection target, or close contact force between the semiconductor chip and the protective sheet (individual piece of the protective sheet).

Figure 7:
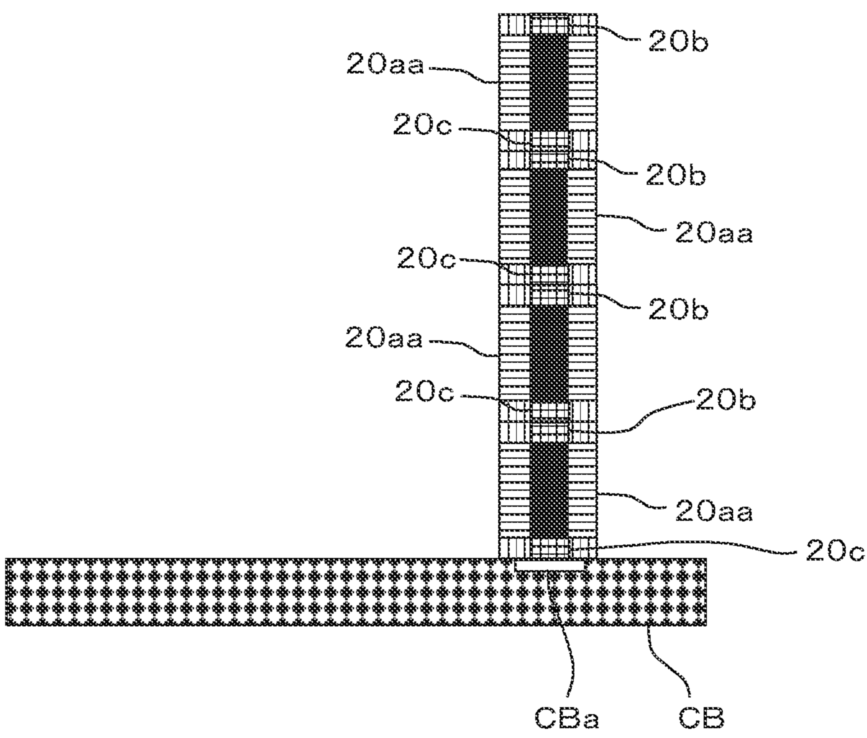
FIG. 7 is a cross-sectional view schematically showing an example configuration in which the semiconductor chips are connected to each other.

As described above, each semiconductor chip with its one surface exposed can be collected by a pickup apparatus including a pin member and a suction tool. Specifically, the pin member is raised from a side of the dicing tape 40 to push up a semiconductor chip to be picked up via the dicing tape 40, and the pushed up semiconductor chip is held by the suction tool to thereby collect the semiconductor chip. As shown in FIG. 7, for example, an electrode part 20*c* on one surface of one semiconductor chip 20*aa* is bonded to an electrode part CBa of a circuit board CB, and an electrode part 20*b* on the other surface of the one semiconductor chip 20*aa* is for example bonded to an electrode part 20*c* on one surface of another semiconductor chip in a repeated manner into a multilayered structure, and thereafter the multilayered structure is subjected to mold processing for packaging to form a semiconductor device. The bonding between the electrode part CBa of the circuit board CB and the electrode part 20*c* on the one surface of the one semiconductor chip 20*aa*, and the bonding between the electrode part 20*b* on the other surface of the one semiconductor chip 20*aa* and the electrode part 20*c* on the one surface of the other semiconductor chip 20*aa* can be achieved by, for example, the atomic diffusion bonding method. That is, the protective sheet 10 is used to protect an electrode part of a semiconductor chip directly bonded to an electrode part of the other member.

2'nd Embodiment

Next, a description will be given on the method for producing the semiconductor device according to the 2'nd embodiment with reference to FIG. 6A to FIG. 6C, FIG. 6F, and FIG. 6G as well as FIG. 8A to FIG. 8E. In the method for producing the semiconductor device according to the 2'nd embodiment, the protective sheet 10 according to the second embodiment described above is used as the protective sheet 10. That is, the protective layer 10*a* of the protective sheet 10 includes a resin, more specifically, an acrylic resin.

<Preparation Step S0*b*>

In the method for producing the semiconductor device according to the 2'nd embodiment, the preparation step S0*b* is performed in the same manner as in the method for producing the semiconductor device according to the 1'st embodiment. Specifically, the preparation step S0*b* is performed as shown in FIG. 6A to FIG. 6C.

<Protective Sheet Attaching Step S1*b*>

Figure 8A:
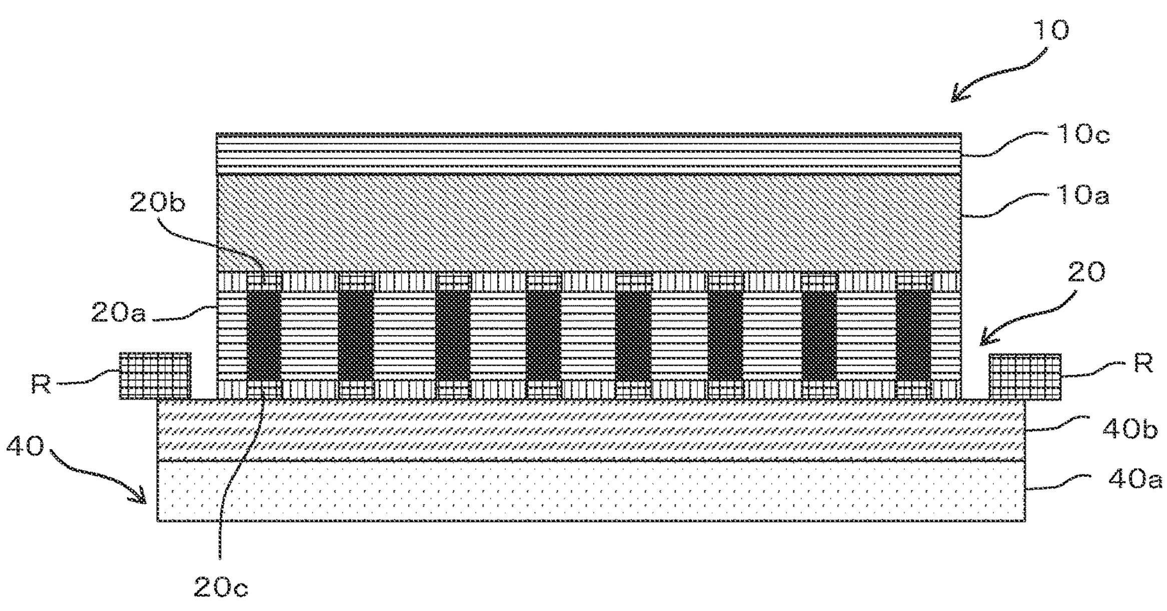
FIG. 8A is a cross-sectional view schematically showing another example state of the protective sheet attaching step in the method for producing the semiconductor device.

In the method for producing the semiconductor device according to the 2'nd embodiment, in a protective sheet attaching step S1*b*, the protective sheet 10 is attached to the semiconductor wafer 20, as shown in FIG. 8A. Specifically, the first release liner 10*b* is removed from the protective sheet 10 to have one surface of the protective layer 10*a* exposed and attach the exposed surface to one surface of the semiconductor wafer 20 (i.e., surface on which the electrode part 20*b* is disposed), to thereby attach the protective sheet 10 to the semiconductor wafer 20 with the other surface of the protective layer 10*a* not exposed. The protective sheet attaching step S1*b* in the method for producing the semiconductor device according to the 2'nd embodiment differs from the protective sheet attaching step S1*a* in the method for producing the semiconductor device according to the 1'st embodiment in that, in the protective sheet attaching step S1*b*, the protective sheet 10 is attached to the semiconductor wafer 20 with the other surface of the protective layer 10*a* not exposed. In the example shown in FIG. 8A, the other surface of the protective layer 10*a* is covered with the second release liner 10*c* with the second release liner 10*c* not removed from the protective sheet 10, but it is not necessary in the protective sheet attaching step S1*b* that the other surface of the protective layer 10*a* be covered with the second release liner 10*c*. The second release liner 10*c* can be removed from the protective sheet 10 to have the other surface of the protective layer 10*a* exposed in the protective sheet attaching step S1*b*, followed by performing the fragile part forming step to be described later.

Figure 8B:
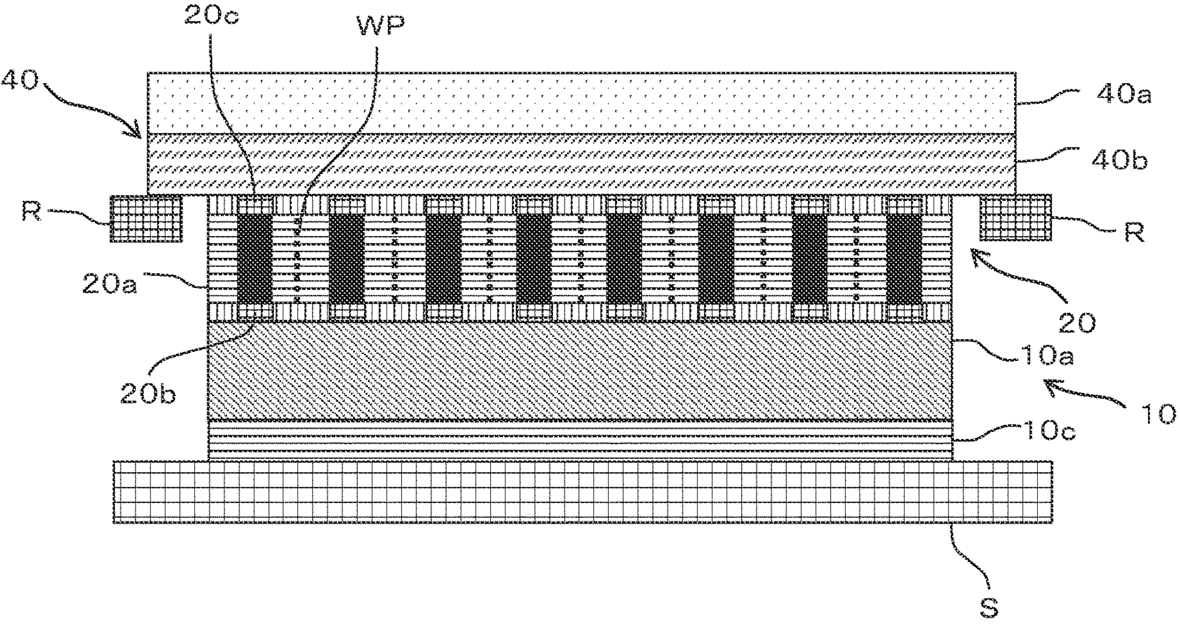
FIG. 8B is a cross-sectional view schematically showing another example state of the fragile part forming step in the method for producing the semiconductor device.

Next, as shown in FIG. 8B, the fragile part WP is formed inside the semiconductor wafer body 20*a* in the same manner as in the method for producing the semiconductor device according to the 1'st embodiment, except that the semiconductor wafer 20 having the second release liner 10*c* of the protective sheet 10 abutted thereto (i.e., having the other surface of the protective layer 10*a* covered with the second release liner 10*c*) is placed on the stage S of the stealth dicer (fragile part forming step).

Figure 8C:
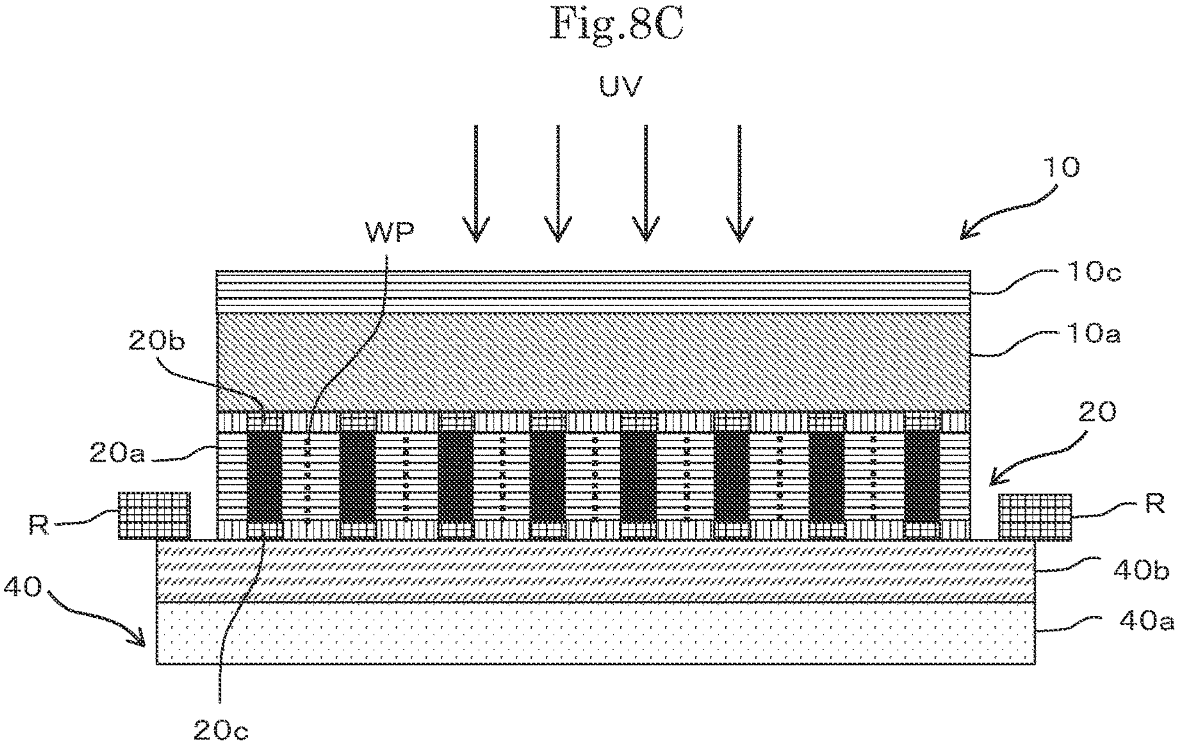
FIG. 8C is a cross-sectional view schematically showing an example state of a protective layer curing step in the method for producing the semiconductor device.
Figure 8D:
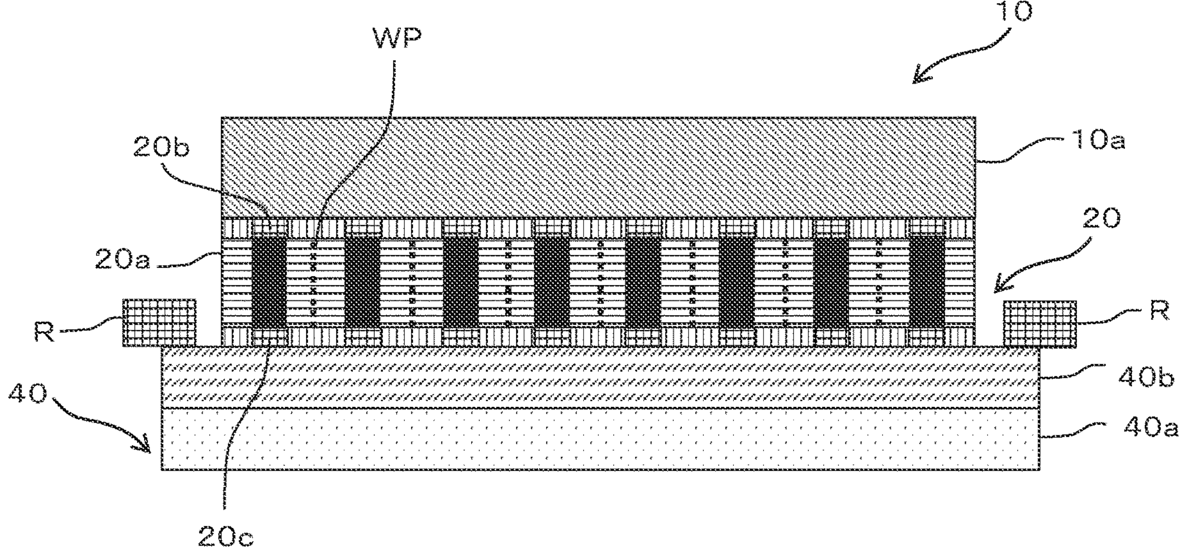
FIG. 8D is a cross-sectional view schematically showing an example state of a release liner removing step in the method for producing the semiconductor device.

Then, the semiconductor wafer 20 is removed from the stage S of the stealth dicer, and thereafter irradiated with a UV ray from the side of the second release liner 10*c* using a UV (ultraviolet) ray irradiation source (e.g., trade name "UM-810" manufactured by Nitto Seiki Co., Ltd. (high pressure mercury lamp, 60 mW/cm$^2$)), as shown in FIG. 8C, to cure the protective layer 10*a* (protective layer curing step). When the resin included in the protective layer 10*a* is an acrylic resin, the cumulative UV dose is preferably 200 mJ/cm$^2$ to 500 mJ/cm$^2$. Then, as shown in FIG. 6D, the second release liner 10*c* is removed from the cured protective layer 10*a* (release liner removing step).

<Semiconductor Wafer Cutting Step S2*b*>

In the method for producing the semiconductor device according to the 2'nd embodiment, as shown in FIG. 6F and FIG. 6G, a semiconductor wafer cutting step S2*b* is performed in the same manner as described in the method for producing the semiconductor device according to the 1'st embodiment.

<Protective Sheet Removing Step S3*b*>

Figure 8E:
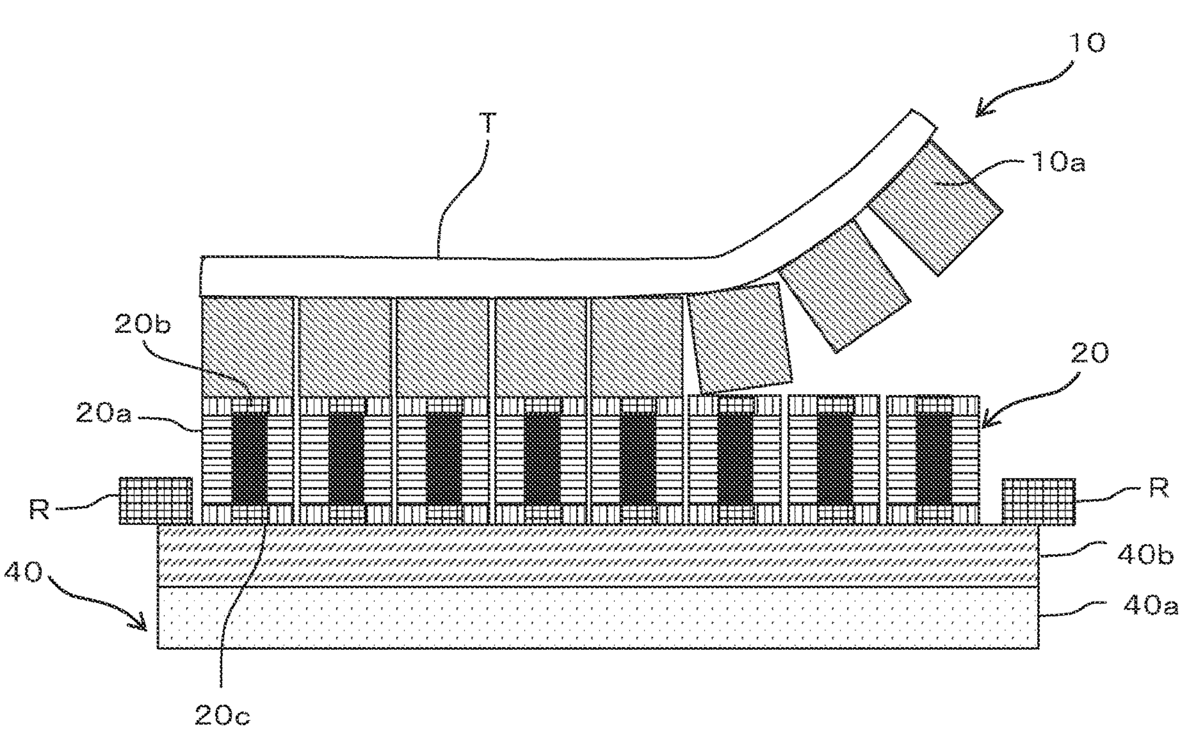
FIG. 8E is a cross-sectional view schematically showing another example state of the protective sheet removing step in the method for producing the semiconductor device.

In the method for producing the semiconductor device according to the 2'nd embodiment, in a protective sheet removing step S3*b*, a release tape T is attached to the individual pieces of the protective layer 10*a* and pulled upward to remove the individual pieces of the protective layer 10*a* from the respective semiconductor chips, as shown in FIG. 8E, thereby having one surface of each of the semiconductor chips (i.e., surface not attached to the dicing tape 40) exposed.

As described above, each semiconductor chip with its one surface exposed can be collected by the pickup apparatus including the pin member and the suction tool as descried in the method for producing the semiconductor device according to the list embodiment. As shown in FIG. 7, for example, the electrode part 20*c* on one surface of one semiconductor chip 20*aa* is bonded to the electrode part CBa of the circuit board CB, and an electrode part 20*b* on the other surface of the one semiconductor chip 20*aa* is for example bonded to an electrode part 20*c* on one surface of another semiconductor chip 20*aa* in a repeated manner into a multilayered structure, and thereafter the multilayered structure is subjected to mold processing for packaging to form a semiconductor device.

The method for producing the semiconductor device using the protective sheet 10 has been described as above by way of the 1'st embodiment and the 2'nd embodiment. However, the method for producing the semiconductor device using the protective sheet 10 is not limited to these and various modification can be made.

[Method for Producing Glass Piece Forming Display Surface of Display Apparatus]

A method for producing a glass piece forming a display surface of a display apparatus according to this embodiment includes: a protective sheet attaching step S1' of attaching a protective sheet to one surface of a glass plate for obtaining the glass piece for forming a display surface of a display apparatus so as to protect the one surface; a glass plate dividing step S2' of dividing the glass plate with the protective sheet attached into pieces with spaces therebetween in a plane direction to obtain a plurality of the glass pieces to which divided pieces of the protective sheet are respectively attached; and a protective sheet removing step S3' of removing the divided pieces of the protective sheet respectively from the plurality of glass pieces, in which the protective sheet includes a protective layer for being attached to the one surface of the glass plate or one surface of each of the plurality of glass pieces, and the protective layer is made of one of a water-soluble resin composition and a curable resin composition with its adhesiveness reducible by curing reaction.

The protective sheet attaching step S1' can be performed in the same manner as described in the section "Protective sheet attaching step S1*a*" or "Protective sheet attaching step S1*b*" in the above methods for producing the semiconductor device. The glass plate cutting step S2' can be performed in the same manner as described in the section "Semiconductor wafer cutting process S2*a*" or "Semiconductor wafer cutting process S2*b*" in the above methods for producing the semiconductor device. Further, the protective sheet removing step S3' can be performed in the same manner as described in the section "Protective sheet removing step S3*a*" or "Protective sheet removing step S3*b*" in the above methods for producing the semiconductor device.

The matters disclosed herein include the following.

(1)

A protective sheet for being attached to a protected surface of an electronic component having the protected surface, one surface of a glass piece forming a display surface of a display apparatus, or one surface of a glass plate for obtaining the glass piece, the protective sheet including:

- a protective layer for being attached to the protected surface of the electronic component, the one surface of the glass piece, or the one surface of the glass plate, in which
- the protective layer is made of one of a water-soluble resin composition and a curable resin composition with its adhesiveness reducible by curing reaction.

Such a configuration enables the protective layer of the protective sheet to protect the protected surface of the electronic component, the one surface of the glass piece forming the display surface of the display apparatus, or the one surface of the glass plate for obtaining the glass piece, and can thus suppress a large number of minute foreign matters generated in, for example, the dicing step from adhering to the protected surface of the electronic component or the one surface of the glass piece. As a result, a large number of minute foreign matters can be suppressed from remaining on the protected surface of the electronic component or the one surface of the glass piece.

(2)

The protective sheet according to (1) above, in which

- the protective layer is made of the water-soluble resin composition, and
- the water-soluble resin composition includes at least one water-soluble polymer composition selected from the group consisting of a polyvinyl alcohol, a water-soluble polyester, and polyethylene oxide.

Such a configuration enables the protective layer to be further easily removed from the protected surface of the electronic component or the one surface of the glass piece by applying water to the protective layer when the protective layer is removed from the protected surface of the electronic component or the one surface of the glass piece. That is, the protective layer can be removed with good workability from the protected surface of the electronic component or the one surface of the glass piece.

(3)

The protective sheet according to (1) above, in which

- the protective layer is made of the curable resin composition with its adhesiveness reducible by curing reaction, and
- the curable resin composition includes an acrylic resin, and is configured to be cured by heat or an active energy ray.

Such a configuration can accelerate the curing reaction of the protective layer to impart moderate hardness to the protective layer, and thus enables the protective layer to be relatively easily removed from the protected surface of the electronic component or the one surface of the glass piece. That is, the protective layer can be relatively easily removed from the protected surface of the electronic component or the one surface of the glass piece.

(4)

A method for producing an electronic component, the method including:

- a protective sheet attaching step of attaching a protective sheet to a connected electronic component product including a plurality of the electronic components that have protected surfaces and are connected to each other with the protected surfaces facing in a same direction, so as to protect the protected surfaces of the plurality of electronic components:
- a connected electronic component product dividing step of dividing the connected electronic component product with the protective sheet attached into pieces with spaces therebetween in a plane direction to obtain the plurality of electronic components to which divided pieces of the protective sheet are respectively attached; and
- a protective sheet removing step of removing the divided pieces of the protective sheet respectively from the plurality of electronic components, in which
- the protective sheet includes a protective layer for being attached to the protected surfaces, and the protective layer is made of one of a water-soluble resin composition and a curable resin composition with its adhesiveness reducible by curing reaction.

Such a configuration can suppress a large number of minute foreign matters generated while the electronic component is produced from adhering to the protected surface of the electronic component. As a result, a large number of the minute foreign matters can be suppressed from remaining on the protected surface of the electronic component.

(5)

A method for producing a glass piece for a display surface of a display apparatus, the method including:

a protective sheet attaching step of attaching a protective sheet to one surface of a glass plate for obtaining the glass piece for forming the display surface of the display apparatus so as to protect the one surface;

a glass plate dividing step of dividing the glass plate with the protective sheet attached into pieces with spaces therebetween in a plane direction to obtain a plurality of the glass pieces to which divided pieces of the protective sheet are respectively attached;

a protective sheet removing step of removing the divided pieces of the protective sheet respectively from the plurality of glass pieces, in which the protective sheet includes a protective layer for being attached to one surface of the glass plate or one surface of each of the plurality of glass pieces, and the protective layer is made of one of a water-soluble resin composition and a curable resin composition with its adhesiveness reducible by curing reaction.

Such a configuration can suppress a large number of minute foreign matters generated while the glass piece forming the display surface is produced from adhering to the one surface of the glass piece forming the display surface. As a result, a large number of the minute foreign matters can be suppressed from remaining on the one surface of the glass piece forming the display surface.

The protective sheet, the method for producing the electronic component, and the method for producing the glass piece forming the display surface of the display apparatus, according to the present invention, are not limited to the aforementioned embodiments. The protective sheet, the method for producing the electronic component, and the method for producing the glass piece forming the display surface of the display apparatus, according to the present invention, are not limited by the aforementioned operational effects, either. Various modifications can be made to the protective sheet, the method for producing the electronic component, and the method for producing the glass piece forming the display surface of the display apparatus, according to the present invention, without departing from the gist of the present invention.

The aforementioned embodiments have been described by taking, for example, the case where, in the semiconductor wafer 20, the outermost surface of one insulating layer 20*e* is flush with the outermost surface of each electrode part 20*b*, and the outermost surface of the other insulating layer 20*e* is flush with the outermost surface of each electrode part 20*c*, but the configuration of how each electrode part 20*b*, 20*c* is attached in the semiconductor wafer 20 is not limited thereto. For example, the configuration of the semiconductor wafer 20 can be such that the outermost surface of each electrode part 20*b* projects from the outermost surface of the one insulating layer 20*e*, and the outermost surface of each electrode part 20*c* projects from the outermost surface of the other insulating layer 20*e*. The configuration can further be such that each electrode part 20*b* and each electrode part 20*c* are each formed of a solder ball.

EXAMPLES

Next, the present invention will be described in more detail by way of Examples. The following examples are intended to illustrate the present invention in further detail, and are not intended to limit the scope of the present invention.

Example 1

An aqueous dispersion solution with a polyvinyl alcohol (saponification degree of 65, average polymerization degree of 240) dispersed in water was prepared in a container. Next, the container containing the aqueous dispersion solution therein was placed in a water bath at 90° C. and stirred to dissolve the polyvinyl alcohol in water, thereby obtaining a first protective layer composition. Then, the first protective layer composition was applied with a thickness of 10 μm to a release treatment surface of a first PET release liner having a surface subjected to silicone release treatment (product name MRA50 manufactured by Mitsubishi Chemical Corporation; thickness of 50 μm), using an applicator. Thereafter, the first PET release liner with the first protective layer composition applied thereto was allowed to dry at 110° C. for two minutes to obtain a protective layer on the first PET release liner. Then, a release treatment surface of a second PET release liner having a surface subjected to silicone release treatment (product name MRA25 manufactured by Mitsubishi Chemical Corporation; thickness of 25 μm) was attached to the protective layer to obtain a protective sheet according to Example 1.

The saponification degree and the average polymerization degree of the polyvinyl alcohol were measured in accordance with the respective methods described in the aforementioned embodiments.

Example 2

A protective sheet according to Example 2 was obtained in the same manner as in Example 1, except that a polyvinyl alcohol having a saponification degree of 80 and an average polymerization degree of 240 was used. In Example 2, the saponification degree and the average polymerization degree of the polyvinyl alcohol were determined in the same manner as in Example 1.

Example 3

A protective sheet according to Example 3 was obtained in the same manner as in Example 1, except that a polyvinyl alcohol having a saponification degree of 74 and an average polymerization degree of 500 was used. In Example 3, the saponification degree and the average polymerization degree of the polyvinyl alcohol were determined in the same manner as in Example 1.

Example 4

A protective sheet according to Example 4 was obtained in the same manner as in Example 1, except that a polyvinyl alcohol having a saponification degree of 88 and an average polymerization degree of 500 was used. In Example 4, the saponification degree and the average polymerization degree of the polyvinyl alcohol were determined in the same manner as in Example 1.

Example 5

A protective sheet according to Example 5 was obtained in the same manner as in Example 1, except that a polyvinyl alcohol having a saponification degree of 65 and an average polymerization degree of 100 was used. In Example 5, the saponification degree and the average polymerization degree of the polyvinyl alcohol were determined in the same manner as in Example 1.

Example 7

A protective sheet according to Example 7 was obtained in the same manner as in Example 1, except that a water-soluble polyester (trade name "Z-221" manufactured by GOO Chemical Co., Ltd.) was used in substitution for the polyvinyl alcohol. The mass average molecular weight Mw of the water-soluble polyester was 14,000. The mass average molecular weight Mw was measured in accordance with the method described in the aforementioned embodiments. The acid value of the water-soluble polyester was less than 5 mgKOH/g.

Example 8

A protective sheet according to Example 8 was obtained in the same manner as in Example 1, except that a water-soluble polyester (trade name "Z-592" manufactured by GOO Chemical Co., Ltd.) was used in substitution for the polyvinyl alcohol. The mass average molecular weight Mw of the water-soluble polyester was 30,000. The mass average molecular weight Mw was measured in accordance with the method described in the aforementioned embodiments. The acid value of the water-soluble polyester was less than 5 mgKOH/g.

Example 9

A protective sheet according to Example 9 was obtained in the same manner as in Example 1, except that a water-soluble polyester (trade name "Z-730" manufactured by GOO Chemical Co., Ltd.) was used in substitution for the polyvinyl alcohol. The mass average molecular weight Mw of the water-soluble polyester was 3,000. The mass average molecular weight Mw was measured in accordance with the method described in the aforementioned embodiments. The acid value of the water-soluble polyester was about 50 mgKOH/g.

Example 10

A protective sheet according to Example 10 was obtained in the same manner as in Example 1, except that a polyethylene oxide (trade name "PEO-3" manufactured by Sumitomo Seika Chemicals Company, Limited) was used in substitution for the polyvinyl alcohol, and the polyethylene oxide was dissolved in water without heating the aqueous dispersion solution. The mass average molecular weight Mw of the polyethylene oxide was 600,000 (600 thousand). The mass average molecular weight Mw was measured in accordance with the method described in the aforementioned embodiments.

Example 11

A protective sheet according to Example 11 was obtained in the same manner as in Example 1, except that a polyethylene oxide (trade name "PEO-8" manufactured by Sumitomo Seika Chemicals Company, Limited) was used in substitution for the polyvinyl alcohol, and the polyethylene oxide was dissolved in water without heating the aqueous dispersion solution. The mass average molecular weight Mw of the polyethylene oxide was 2,000,000 (2 million). The mass average molecular weight Mw was measured in accordance with the method described in the aforementioned embodiments.

<Evaluation of Minute Foreign Matters>

A bare wafer with the protective sheet according to each of Examples 1 to 5 and Examples 8 to 11 attached to a surface thereof was cut into a plurality of semiconductor chips, and then an evaluation was made for minute foreign matters remaining on the plurality of semiconductor chips. The evaluation of the minute foreign matters was performed as follows:

(1) The second PET release liner was removed from the prepared protective sheet to have one surface of the protective layer of the protective sheet exposed.

(2) A bare wafer (having an outer diameter of 12 inches (300 mm) and a thickness of 40 μm) with a glass carrier attached to one surface and a dicing tape attached to the other surface (specifically, attached to an adhesive layer of the dicing tape) was prepared, and the glass carrier was removed from the one surface of the bare wafer to obtain the bare wafer with the dicing tape. Then, the protective sheet was attached to the surface of the bare wafer with the glass carrier removed therefrom. Note that a dicing ring is attached to an end edge of the adhesive layer of the dicing tape.

(3) The bare wafer with the protective sheet attached was placed on a stage of a vacuum mounter (model MV3000 manufactured by Nitto Seiki Co., Ltd.), and the protective sheet was caused to adhere to the bare wafer at a temperature of the stage of 90° C. (hereinafter referred to as bare wafer with the protective sheet).

(4) The bare wafer with the protective sheet was placed on a stage of a stealth dicer (model DFL7361 manufactured by DISCO Corporation) to have the first PET release liner in abutting contact with the stage, and then the bare wafer was irradiated with a laser beam from a laser irradiation source of the stealth dicer along a predetermined dicing position to form a fragile part inside the bare wafer. Specifically, the fragile part was formed into a grid shape inside the bare wafer to obtain a plurality of bare chips each having a plane dimension of 10 mm×10 mm after cutting. The irradiation of the laser beam from the laser irradiation source shall follow the conditions described in the section of the embodiments. After the fragile part was formed inside the bare wafer, the first PET release liner was removed from the other surface of the protective layer of the protective sheet to have the other surface of the protective layer of the protective sheet exposed (hereinafter referred to as bare wafer with the fragile part).

(5) The bare wafer with the fragile part was removed from the stage of the stealth dicer, and then the bare wafer with the fragile part was spread (expanded) in its plane direction using an expanding apparatus (model DDS2300 manufactured by DISCO Corporation) to cut the bare wafer with the fragile part into a plurality of semiconductor chips and also cut the protective layer of the protective sheet into individual pieces each having a size corresponding to the size of each of the plurality of semiconductor chips. The expansion using the expanding apparatus shall be performed at a temperature of −15° C. at an expanding speed of 200 mm/s.

(6) Water was applied (i.e., water was injected) to the plurality of individual pieces of the protective layer from a water injection part of a water washing mechanism of the expanding apparatus while rotating the stage of the expanding apparatus at 1000 rpm, and the individual pieces of the protective layer were removed from the surfaces of the respective semiconductor chips toward the outside of the stage to thereby have one surface of each of the semiconductor chips (i.e., surface with no dicing tape attached) exposed. The injection amount of water (i.e., volume of water) shall fall within a range of 100 L/min to 300 L/min, and the period of time for injecting water shall fall within a range of 60 seconds to 90 seconds. As the water, low temperature water (23±2° C.) shall be first used, and if the individual pieces of the protective layer cannot be removed with low temperature water, then high temperature water (40±2° C.) shall be used to remove the individual pieces of the protective layer. For Example 9, the individual pieces of the protective layer were removed using 0.1 mol/L ammonia water (at 23±2° C.) in substitution for water.

(7) Each semiconductor chip with its one surface exposed was picked up using a pickup apparatus, and then the surface of the semiconductor chip with the individual piece of the protective layer removed therefrom was observed using a digital microscope (model VHX-500 manufactured by Keyence Corporation). The observation of the surface of the semiconductor chip using the digital microscope was made for a 10 mm×10 mm area selected at random in the surface at an observation magnification of 50 times. Then, the number of minute foreign matters remaining on the surface was counted. The observation using the digital microscope was carried out for five semiconductor chips, and the number of minute foreign matters was obtained by arithmetic averaging. The obtained value was rounded to the nearest integer.

(8) Whether or not the remaining of the minute foreign matters was acceptable was evaluated based on the following evaluation criteria:

Excellent: Less than 10 minute foreign matters cells remain.

Poor: 10 or more minute foreign matters remain.

The results are shown in Table 1 below.

<Evaluation of Cuttability of Semiconductor Wafer and Removability of Protective Layer>

When the above evaluation was made for the minute foreign matters, the cuttability of the semiconductor wafer and the removability of the protective layer were also evaluated simultaneously for each of Examples 1 to 5 and Examples 7 to 11. The cuttability of the semiconductor wafer was evaluated by observing all of the plurality of bare chips each having a size of 10 mm×10 mm, which were obtained after cutting, to see whether there is a sufficient kerf width (i.e., distance between each two bare chips) (i.e., whether the kerf width is 10 μm or more) and whether there is a connected portion in the protective layer. The removability of the protective layer was evaluated by analyzing the surfaces of all of the plurality of bare chips each having a size of 10 mm×10 mm, which were obtained after cutting, using a Fourier transform infrared spectrophotometer (FT-IR) to see whether residual organic matters remain on these surfaces. The evaluation criteria of the cuttability of the semiconductor wafer and the removability of the protective layer were as follows:

-Cuttability of Semiconductor Wafer

Excellent: Sufficient kerf widths are found for all of the plurality of bare chips with no connected portion in the protective layer.

Poor: One or more of the plurality of bare chips have an insufficient kerf width, or have a connected portion in the protective layer.

-Removability of Protective Layer

Excellent: No residual organic matters are found for all of the plurality of bare chips (a maximum absorption at 800 to 4000 $cm^{-1}$ of ≤0.05)

Poor: Residual organic matters are found for one or more of the plurality of bare chips (a maximum absorption at 800 to 4000 $cm^{-1}$ of >0.05)

The results are shown in Table 1 below.

<Durability to Low Temperature Water>

Durability when washing with low temperature (23±2° C.) water, i.e., durability to low temperature water was evaluated for the protective layer according to Example 7 (containing a water-soluble polyester), the protective layer according to Example 8 (containing a water-soluble polyester), the protective layer according to Example 9 (containing a water-soluble polyester), the protective layer according to Example 10 (containing polyethylene oxide), and the protective layer according to Example 11 (containing polyethylene oxide). Specifically, in (6) of <Evaluation of minute foreign matters> above, the case where the protective layer could not be removed with low temperature water was determined as "Excellent" while the case where the protective layer could be removed with low temperature water was determined as "Poor". The results are shown in Table 1 below.

<Film-Forming Performance>

The film-forming performance when the protective layer was formed was evaluated for the protective layer according to each of Examples 7 to 11. Specifically, when the first protective layer forming composition was applied at a certain thickness to the release treatment surface of the first PET release liner using an applicator, the case where the composition was capable of being sufficiently spread or capable of being applied to have a desired thickness was evaluated as "Excellent" while the other cases were determined as "Poor". The results are shown in Table 1 below.

Example 6

(Preparation of Acrylic Polymer)

In a reaction vessel including a cooling pipe, a nitrogen introducing pipe, a thermometer, and a stirrer, 11 mass parts of hydroxyethyl acrylate (HEA) and 89 mass parts of 2-ethylhexyl acrylate (2EHA) were added as monomers, 2,2'-azobisbutyronitrile (AIBN) was added as a thermal polymerization initiator, and further butyl acetate was added as a reaction solvent to have a concentration of the monomers of 36 mass %, to prepare a first reaction solution. The first reaction solution was subjected to polymerization treatment under nitrogen gas stream to obtain a first acrylic polymer A as an intermediate. In the polymerization treatment, a first polymerization treatment at a temperature of 62° C. for 4 hours was carried out, followed by a second polymerization treatment at a temperature of 75° C. for 2 hours. To this first reaction solution including the first acrylic polymer A, 13 mass parts of 2-isocyanatoethyl methacrylate (MOI) was added as a monomer and 0.07 mass part of dibutyltin dilaurylate was added based on 100 mass parts of the first acrylic polymer A to prepare a second reaction solution. The second reaction solution was subjected to addition reaction treatment under airflow at 50° C. for 12 hours to obtain an acrylic polymer A' (acrylic resin) according to Example 6. As the MOI, the trade name "Karenz MOI (registered trademark)" manufactured by Showa Denko K.K. was used. "Karenz MOI (registered trademark)" is a polymerizable group-containing (meth) acrylate having an isocyanate group, and has a vinyl group as a polymerizable group.

(Preparation of Adhesive Solution)

To the second reaction solution including the acrylic polymer A' according to Example 6, 0.8 mass part of a polyisocyanate compound (trade name "TAKENATE D-101A" manufactured by Mitsui Chemicals, Inc.) was added as an external crosslinking agent, and 5 mass parts of a photopolymerization initiator (trade name "Omnirad 127" manufactured by IGM Resins B.V.) was added to prepare an adhesive solution A according to Example 6. The mass parts of the external crosslinking agent and the mass parts of the photopolymerization initiator are the values based on 100 mass parts of the acrylic polymer A' according to Example 6.

(Preparation of Protective Sheet)

The adhesive solution A according to Example 6 was applied using an applicator to the silicone release treatment surface of the first PET release liner (with a thickness of 50 μm) having the surface subjected to silicone release treatment, and allowed to dry at 120° C. for 2 minutes to form an adhesive layer having a thickness of 30 μm. Thereafter, the release treatment surface of the second PET release liner (trade name "MRA25" manufactured by Mitsubishi Chemical Corporation) as a release liner was attached to the adhesive layer, and stored at a temperature of 50° C. for 24 hours to obtain a protective sheet according to Example 6.

<Evaluation of Minute Foreign Matters>

A bare wafer with the protective sheet according to Example 6 attached to a surface thereof was cut into a plurality of semiconductor chips, and then an evaluation was made for minute foreign matters remaining on the surfaces of the plurality of semiconductor chips. The evaluation of the minute foreign matters was performed as follows:

(1) to (3) The same steps as those in (1) to (3) above for the case where the protective sheet according to each of Examples 1 to 5 was used were carried out.

(4) The bare wafer with the protective sheet was placed on a stage of a stealth dicer (model DFL7361 manufactured by DISCO Corporation) to have the first PET release liner in abutting contact with the stage, and then the bare wafer was irradiated with a laser beam from a laser irradiation source of the stealth dicer along a predetermined dicing position to form a fragile part inside the bare wafer. Specifically, the fragile part was formed into a grid shape inside the bare wafer to obtain a plurality of bare chips each having a plane dimension of 10 mm×10 mm after cutting. Then, the protective layer of the protective sheet was irradiated with a UV (ultraviolet) ray from a side of the first PET release liner (with a cumulative dose of 300 mJ/cm$^2$) to be cured, and the first PET release liner was removed from the protective layer of the protective sheet to have the other surface of the protective layer of the protective sheet exposed. The bare wafer with the fragile part was thus obtained.

(5) The semiconductor wafer with the fragile part was cut and separated into a plurality of individual semiconductor chips, and the protective layer of the protective sheet was also cut and separated into individual pieces each having a size corresponding to the size of each of the plurality of semiconductor chips, in the same manner as in (5) for the case where the protective sheet of each of Examples 1 to 5 as above was used.

(6) A release tape (model number 360UL manufactured by Nitto Denko Corporation) was attached to the individual pieces of the protective layer using a laminator, and then pulled upward to remove the individual pieces of the protective layer from the respective semiconductor chips, thereby having one surface of each of the semiconductor chips (i.e., surface with no dicing tape attached) exposed.

(7) For five semiconductor chips, their surfaces with the respective individual pieces of the protective layer removed therefrom were observed using a digital microscope (model VHX-500 manufactured by Keyence Corporation), in the same manner as in (7) above for the case where the protective sheet of each of Examples 1 to 5 as above was used (8) Whether or not the remaining of the minute foreign matters was acceptable was evaluated in the same manner as in (8) above for the case where the protective sheet of each of Examples 1 to 5 was used. The results are shown in Table 1 below.

<Evaluation of Cuttability of Semiconductor Wafer and Removability of Protective Layer>

When the above evaluation was made for the minute foreign matters, the cuttability of the semiconductor wafer and the removability of the protective layer were also evaluated simultaneously for Example 6. The cuttability of the semiconductor wafer and the removability of the protective layer were evaluated according to the same criteria as those for the case of each of above Examples 1 to 5. The results are shown in Table 1 below.

<Thickness of Protective Layer>

The thickness of the protective layer was measured for the protective sheet according to each of Examples 1 to 11. The thickness of the protective layer was determined by measuring the thickness thereof at any 5 positions selected at random using a dial gauge (model R-205 manufactured by PEACOCK), followed by arithmetically averaging these thickness values. The results are shown in Table 1 below <Close Contact Force of Protective Layer to Bare Wafer>

The close contact force of the protective layer to the bare wafer was measured for the protective sheet according to each of Examples 1 to 11. The close contact force of the protective layer to the bare wafer was measured as described in the aforementioned embodiment. The close contact force of the protective layer to the bare wafer was measured for the protective sheet according to Example 6 both before and after UV irradiation.

<Breaking Strength at −15° C. and Elongation at Break at −15° C.'>

The breaking strength at −15° C. and the elongation at break at −15° C. were measured for the protective sheet according to each of Examples 1 to 8. For the elongation at break at −15° C., specifically, the protective layer having a length of 50 mm, a width of 10 mm, and a thickness of 30 μm as a test piece was pulled in a length direction at a temperature of −15° C., at a distance between chucks of 20 mm (i.e., measured length: $L_0$), and at a tensile speed of 10 mm/see, using a tensile tester (autograph AG-IS manufactured by Shimadzu Corporation), to measure the length of the test piece when the test piece broke (i.e., value $L_1$ obtained by adding the elongation amount to the measured length $L_0$). Then, the elongation at break at −15° C. was calculated based on the equation below:

$$\text{Elongation at break } E=(L_1-L_0)/L_0\times 100$$

Further, the breaking strength at −15° C. was determined by measuring a force applied to the test piece when broken during the tensile test under the same conditions as above using the above test piece and the above tensile tester. The results are shown in Table 1 below.

<Tensile Storage Elastic Modulus at −15° C. and Tensile Storage Elastic Modulus at 25° C.>

The tensile storage elastic modulus at −15° C. and the tensile storage elastic modulus at 25° C. were measured for the protective sheet according to each of Examples 1 to 11. Specifically, the protective layer having a length of 40 mm, a width of 10 mm, and a thickness of 50 μm was used as the test piece to measure the tensile storage elastic modulus in a temperature range of −40° C. to 80° C. at a frequency of 1 Hz, a strain amount of 0.1%, a temperature rising rate of 10° C./min, and a distance between chucks of 20 mm, using a solid viscoelasticity measuring instrument (e.g., model RSAIII manufactured by TA Instruments). In so doing, the tensile storage elastic modulus at −15° C. was determined by reading the value at −15° C., and the tensile storage elastic modulus at 25° C. was determined by reading the value at 25° C. The measurement was performed by pulling the test piece in its length direction. The results are shown in Table 1 below.

<Surface Free Energy>

The surface free energy of the protective layer was measured for the protective sheet according to each of Examples 1 to 5 and for the protective sheet according to each of Examples 7 to 11. The surface free energy of the protective layer was measured as described in the aforementioned embodiment. The results are shown in Table 1 below.

Comparative Example 1

As Comparative Example 1, the semiconductor wafer was cut into a plurality of individual semiconductor chips in the same manner as in, for example, Example 1 except that a bare wafer with no protective sheet attached thereto was used. For Comparative Example 1, only minute foreign matters were evaluated. The results are shown in Table 1 below.

Comparative Example 2

A protective sheet according to Comparative Example 2 was obtained in the same manner as in Example 9, except that another polyethylene oxide (trade name "PEO-4" manufactured by Sumitomo Seika Chemicals Company, Limited) was used in substitution for the polyethylene oxide (trade name "PEO-1" manufactured by Sumitomo Seika Chemicals Company, Limited). The mass average molecular weight Mw of the polyethylene oxide included in the protective sheet according to Comparative Example 2 was 1,000,000 (1 million). The mass average molecular weight Mw was measured in accordance with the method described in the aforementioned embodiments. In the protective sheet according to Comparative Example 2, the polyethylene oxide included in the first protective layer forming composition for forming the protective layer had a mass average molecular weight Mw of as high as 1,000,000, and thus the first protective layer forming composition failed to be sufficiently spread on the release treatment surface of the first PET release liner at the time of forming the protective layer. That is, the film-forming performance could not be evaluated. Thus, "Not measurable" or "Not evaluable" is found in the columns for the evaluations in Table 1 below.

Comparative Example 3

A protective sheet according to Comparative Example 3 was obtained in the same manner as in Example 9, except that polyethylene glycol (trade name "PEG-20000" manufactured by Sanyo Chemical Industries, Ltd.) was used in substitution for polyethylene oxide (trade name "PEO-1" manufactured by Sumitomo Seika Chemicals Company, Limited). The mass average molecular weight Mw of the polyethylene glycol included in the protective sheet according to Comparative Example 3 was 20.000 (20 thousand). The mass average molecular weight Mw was measured in accordance with the method described in the aforementioned embodiments. In the protective sheet according to Comparative Example 3, the polyethylene oxide included in the first protective layer forming composition for forming the protective layer had a mass average molecular weight Mw of as low as 20,000, and thus the first protective layer forming composition failed to be applied to have a desired thickness at the time of forming the protective layer. That is, the film-forming performance could not be evaluated. Thus. "Not measurable" or "Not evaluable" is found in the columns for the evaluations in Table 1 below.

Reference Example 1

As Reference Example 1, the semiconductor wafer was cut into a plurality of individual semiconductor chips in the same manner as in Example 6, except that the protective sheet prepared in the same manner as in Example 6 was used and the protective layer of the protective sheet was not cured. For Reference Example 1, the thickness of the protective layer, the close contact force of the protective layer to the bare wafer before UV irradiation, the breaking strength at −15° C., the elongation at break at −15° C., the cuttability of the semiconductor wafer, and the removability of the protective layer were evaluated. The results are shown in Table 1 below. The tensile storage elastic modulus at −15° C. and the tensile storage elastic modulus at 25° C. were attempted to be measured for Reference Example 1, but such measurements themselves were hardly performed. Further, the evaluation on the minute foreign matters was attempted for Reference Example 1, but it was difficult to count the number of minute foreign matters due to adhesive residue on the surfaces of the semiconductor chips after the individual pieces of the protective layer were removed from the respective individual pieces of the semiconductor chips.

TABLE 1

| | | Example 1 | Example 2 | Example 3 | Example 4 | Example 5 |
|---|---|---|---|---|---|---|
| Type | | Polyvinyl alcohol containing | Polyvinyl alcohol containing | Polyvinyl alcohol containing | Polyvinyl alcohol containing | Polyvinyl alcohol containing |
| Saponification degree | | 65 | 80 | 74 | 88 | 65 |
| Polymerization degree | | 240 | 240 | 500 | 500 | 100 |
| Mass average molecular weight Mw | | — | — | — | — | — |
| Thickness [μm] | | 10 | 10 | 10 | 10 | 10 |
| Adhesive force [GPa] | Before UV irradiation | >7.9 | >7.6 | >8.2 | >8.6 | >8.8 |
| | After UV irradiation | — | — | — | — | — |
| Breaking strength at −15° C. [MPa] | | 42 | 52 | 98 | 115 | 4 |
| Elongation at break at −15° C. [%] | | 3 | 6 | 11 | 8 | 1 |
| Elastic modulus [GPa] | −15° C. | 3300 | 4700 | 3500 | 4500 | 3500 |
| | 25° C. | 2900 | 2800 | 2900 | 2300 | 2700 |
| Contact angle [°] | | 50 | 30 | 50 | 93 | — |
| Surface free energy [mJ/m$^2$] | | 55 | 65 | 54 | 41 | 58 |
| Cuttability | | Excellent | Excellent | Excellent | Excellent | Excellent |
| Protective layer removability | | Excellent | Excellent | Excellent | Excellent | Excellent |
| Particle (minute foreign matters) evaluation | | Excellent (3) | Excellent (4) | Excellent (3) | Excellent (8) | Excellent (5) |
| Durability to low temperature water | | — | — | — | — | — |
| Film-forming performance | | — | — | — | — | — |

| | | Example 6 | Example 7 | Example 8 | Example 9 | Example 10 |
|---|---|---|---|---|---|---|
| Type | | Acrylic resin containing | Water-soluble polyester containing | Water-soluble polyester containing | Water-soluble polyester containing | Polyethylene oxide containing |
| Saponification degree | | — | — | — | — | — |
| Polymerization degree | | — | — | — | — | — |
| Mass average molecular weight Mw | | — | 14,000 | 30,000 | 3,000 | 600,000 |
| Thickness [μm] | | 30 | 10 | 10 | 10 | 10 |
| Adhesive force [GPa] | Before UV irradiation | 1.0 | >8.5 | >8.2 | >8.0 | 0.5 |
| | After UV irradiation | 0.1 | — | — | — | — |
| Breaking strength at −15° C. [MPa] | | 18 | 16 | 20 | — | — |
| Elongation at break at −15° C. [%] | | 25 | 6 | 10 | — | — |
| Elastic modulus [GPa] | −15° C. | 0.2 | 2.3 | 2.2 | 1.9 | 0.6 |
| | 25° C. | 0.05 | 2.2 | 2.1 | 1.5 | 0.2 |
| Contact angle [°] | | — | 62 | 70 | 68 | 60 |
| Surface free energy [mJ/m$^2$] | | — | 52 | 52 | 48 | 53 |
| Cuttability | | Excellent | Excellent | Excellent | Excellent | Poor |
| Protective layer removability | | Excellent | Excellent | Excellent | Excellent | Excellent |
| Particle (minute foreign matters) evaluation | | Excellent (6) | — | Excellent (5) | Excellent (7) | Excellent (4) |
| Durability to low temperature water | | — | Poor | Excellent | Excellent | Poor |
| Film-forming performance | | — | Excellent | Excellent | Excellent | Excellent |

| | | Example 11 | C. Example 1 | C. Example 2 | C. Example 3 | Ref. Example 1 |
|---|---|---|---|---|---|---|
| Type | | Polyethylene oxide containing | No protective layer | Polyethylene oxide containing | Polyethylene oxide containing | Acrylic resin containing |
| Saponification degree | | — | — | — | — | — |
| Polymerization degree | | — | — | — | — | — |
| Mass average molecular weight Mw | | 200,000 | — | 1,000,000 | 20,000 | — |
| Thickness [μm] | | 10 | — | — | — | 30 |
| Adhesive force [GPa] | Before UV irradiation | 0.5 | — | Not measurable | Not measurable | 1.0 |
| | After UV irradiation | — | — | — | — | — |
| Breaking strength at −15° C. [MPa] | | — | — | Not measurable | Not measurable | 5 |
| Elongation at break at −15° C. [%] | | — | — | Not measurable | Not measurable | 150 |
| Elastic modulus [GPa] | −15° C. | 0.8 | — | Not measurable | Not measurable | Not measurable |
| | 25° C. | 0.2 | — | Not measurable | Not measurable | Not measurable |
| Contact angle [°] | | 65 | — | — | — | — |
| Surface free energy [mJ/m$^2$] | | 53 | — | Not measurable | Not measurable | — |
| Cuttability | | Poor | — | Not evaluable | Not evaluable | Poor |
| Protective layer removability | | Excellent | — | Not evaluable | Not evaluable | Poor |
| Particle (minute foreign matters) evaluation | | Excellent (3) | Poor (>200) | Not evaluabie | Not evaluable | Not evaluable |
| Durability to low temperature water | | Poor | — | Not evaluable | Not evaluable | — |
| Film-forming performance | | Excellent | — | Poor | Poor | — |

Table 1 shows that, when the protective sheet according to each of Examples 1 to 6 and Examples 8 to 11 was used, the evaluation of the minute foreign matters was "excellent". In the evaluation of the minute foreign matters, the value in brackets for each Example shows the number of minute foreign objects on the surface of each semiconductor chip. In Comparative Example 1 in which no protective sheet was used, in contrast, the evaluation of the minute foreign matters was "poor", and the number of minute foreign matters on the surface of each semiconductor chip exceeded 200. Each of Comparative Examples 2 and 3 was judged as being "not evaluable" as the protective layer of the protective sheet failed to be sufficiently formed. In Reference Example 1, as described above, it was difficult to count the number of minute foreign matters due to adhesive residue on the surfaces of the semiconductor chips after the individual pieces of the protective layer were removed from the respective individual pieces of semiconductor chips, and the evaluation of the minute foreign matters was hardly carried out.

It is found from these results that use of the protective sheet when a semiconductor wafer is cut and divided into a plurality of individual semiconductor chips can suppress a large number of minute foreign matters from remaining on the surfaces of the respective individual pieces of the semiconductor chips.

A comparison for the durability to low temperature water between the protective sheet according to Example 7 and the protective sheet according to Example 8 found that the protective sheet according to Example 8 was evaluated as "Excellent" while the protective sheet according to Example 7 was evaluated as "Poor". This appears to have been caused by the mass average molecular weight Mw of the water-soluble polyester included in each of the protective layers. Further, a comparison for the film-forming performance between the protective sheets according to Examples 10 and 11 and the protective sheets according to Comparative Examples 2 and 3 found that the protective sheets according to Examples 10 and 11 were evaluated as "Excellent" while the protective sheets according to Comparative Examples 2 and 3 were evaluated as "Poor". This also appears to have been caused by the mass average molecular weight Mw of the polyethylene oxide or the polyethylene glycol included in each of the protective layers.

REFERENCE SIGNS LIST

10: Protective sheet
**10*a***: Protective layer
**10*b***: First release liner
**10*c***: Second release liner
20: Semiconductor wafer
**20*a***: Semiconductor wafer body
**20*b***: Electrode part
**20*c***: Electrode part
**20*d***: Conductive part
**20*e***: Insulating layer
30: Glass carrier
40: Dicing tape
**40*a***: Base layer
**40*b***: Adhesive layer
50: Semiconductor chip
**50*a***: Semiconductor chip body
**50*b***: Electrode part
**50*c***: Circuit forming area
100: Wafer level package
110: Circuit board
120: Semiconductor package
**120*a***: Glass piece
200: Image sensor package
210: Sensor chip body
220: Adhesive layer
230: Glass piece
200': Layered product for image sensor package
210': Sensor wafer body
220': Adhesive layer
230': Glass plate

The invention claimed is:

1. A protective sheet for being attached to a protected surface of an electronic component having the protected surface, one surface of a glass piece forming a display surface of a display apparatus, or one surface of a glass plate for obtaining the glass piece, the protective sheet comprising:

a protective layer for being attached to the protected surface of the electronic component, the one surface of the glass piece, or the one surface of the glass plate, a first release liner and a second release liner that are in abutting contact respectively with both surfaces of the protective layer, wherein the protective layer is made of a water-soluble resin composition, and the surface of the protective layer with which the first release liner is in abutting contact and the surface of the protective layer with which the second release liner is in abutting contact each have a surface free energy of 25 $mJ/m^2$ or more and 85 $mJ/m^2$ or less.

2. The protective sheet according to claim 1, wherein the water-soluble resin composition comprises at least one water-soluble polymer composition selected from the group consisting of a polyvinyl alcohol, a water-soluble polyester, and polyethylene oxide.

3. A method for producing an electronic component, the method comprising:

attaching a protective layer of the protective sheet according to claim 1, to a connected electronic component product comprising a plurality of the electronic components that have protected surfaces and are connected to each other with the protected surfaces facing in a same direction, so as to protect the protected surfaces of the plurality of electronic components;

dividing the connected electronic component product with the protective layer of the protective sheet attached into pieces with spaces therebetween in a plane direction to obtain the plurality of electronic components to which divided pieces of the protective layer of the protective sheet are respectively attached; and removing the divided pieces of the protective layer of the protective sheet respectively from the plurality of electronic components through washing with water, wherein in the attaching of the protective layer of the protective sheet, the first release liner is removed from the protective layer to obtain an exposed surface of the protective layer exposed by the removing, and the exposed surface of the protective layer together with the second release liner is attached to the protected surface, followed by having the second release liner removed from the protective layer.

4. A method for producing a glass piece for a display surface of a display apparatus, the method comprising:

attaching a protective layer of the protective sheet according to claim 1, to the one surface of the glass plate for obtaining the glass piece for forming the display surface of the display apparatus so as to protect the one surface;

dividing the glass plate with the protective layer of the protective sheet attached into pieces with spaces therebetween in a plane direction to obtain a plurality of the glass pieces to which divided pieces of the protective layer of the protective sheet are respectively attached;

removing the divided pieces of the protective layer of the protective sheet respectively from the plurality of glass pieces through washing with water, wherein in the attaching of the protective layer of the protective sheet, the first release liner is removed from the protective layer to obtain an exposed surface of the protective layer exposed by the removing, and the exposed surface of the protective layer together with the second release liner is attached to the protected surface, followed by having the second release liner removed from the protective layer.

5. The protective sheet according to claim 1, wherein the protective layer is removable through washing with water.

* * * * *